United States Patent
Hijioka et al.

(10) Patent No.: US 8,897,832 B2
(45) Date of Patent: Nov. 25, 2014

(54) SEMICONDUCTOR DEVICE AND COMMUNICATION SYSTEM INCLUDING THE SAME

(71) Applicant: Renesas Electronics Corporation, Kanagawa (JP)

(72) Inventors: Kenichiro Hijioka, Kanagawa (JP); Koichi Yamaguchi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 148 days.

(21) Appl. No.: 13/739,065

(22) Filed: Jan. 11, 2013

(65) Prior Publication Data

US 2013/0203361 A1 Aug. 8, 2013

(30) Foreign Application Priority Data

Feb. 3, 2012 (JP) ................................ 2012-021773

(51) Int. Cl.
*H04M 1/00* (2006.01)
*H01L 23/495* (2006.01)
*H04B 1/40* (2006.01)

(52) U.S. Cl.
CPC ........ *H04B 1/40* (2013.01); *H01L 2224/32245* (2013.01); *H01L 23/495* (2013.01); *H01L 2224/73265* (2013.01); *H01L 23/49541* (2013.01); *H01L 2224/48247* (2013.01); *H01L 2224/48137* (2013.01); *H01L 23/49575* (2013.01); *H01L 2223/6677* (2013.01)
USPC ..................... 455/550.1; 455/252.1; 455/333; 455/334

(58) Field of Classification Search
USPC ................ 455/78, 252.1, 313, 323, 333, 334, 455/550.1, 551, 552.1, 553.1
See application file for complete search history.

(56) References Cited

U.S. PATENT DOCUMENTS 7,013,123 B2 * 3/2006 Takikawa et al. ............. 455/333
7,369,817 B2 * 5/2008 Takikawa et al. ............... 455/73
(Continued)

FOREIGN PATENT DOCUMENTS

JP 3563672 B 9/2004
JP 2005-38232 2/2005
(Continued)

OTHER PUBLICATIONS

Y. Yoshida et aL, "A 2 Gb/s Bi-Directional Inter-Chip Data Transceiver With Differential Inductors for High Density Inductive Channel Array", IEEE Journal of Solid-State Circuits, 2008, vol. 43, No. 11, pp. 2363-2369.

(Continued)

Primary Examiner — Nhan Le
(74) Attorney, Agent, or Firm — Young & Thompson

(57) ABSTRACT

Disclosed is a semiconductor device including a semiconductor chip and a semiconductor package. The semiconductor package includes an antenna formed of a lead frame, a first wire that connects the antenna and a first electrode pad of the semiconductor chip, and a second wire that connects the antenna and a second electrode pad of the semiconductor chip. The semiconductor chip is disposed in one of four regions in the semiconductor package sectioned by line segments connecting midpoints of two pairs of opposing sides of the semiconductor package. A centroid of the semiconductor chip is positioned outside a closed curve composed of a straight line segment connecting a first connection point where the antenna and the first wire are connected and a second connection point where the antenna and the second wire are connected, and a line connecting the first and second connection points along the antenna.

20 Claims, 19 Drawing Sheets

(56) References Cited

U.S. PATENT DOCUMENTS

| | | | |
|---|---|---|---|
| 7,962,105 B2 * | 6/2011 | Sato et al. | 455/78 |
| 8,126,501 B2 * | 2/2012 | Danno et al. | 455/550.1 |
| 8,401,496 B2 * | 3/2013 | Goto et al. | 455/83 |
| 2009/0283883 A1 | 11/2009 | Igarashi et al. | |

FOREIGN PATENT DOCUMENTS

| | | |
|---|---|---|
| JP | 2006-221211 | 8/2006 |
| JP | 3877732 B | 2/2007 |
| JP | 3926323 | 6/2007 |
| JP | 2009-278051 | 11/2009 |

OTHER PUBLICATIONS

N. Miura et aL, "A High-Speed Inductive-Coupling Link With Burst Transmission", IEEE Journal of Solid-State Circuits, 2009, vol. 44, No. 3, pp. 947-955.

T. Takeya et aL, "A 12Gb/s Non-Contact Interface with Coupled Transmission Lines", IEEE International Solid-State Circuits Conference, Digest of Technical Papers, 2011, pp. 492-494.

* cited by examiner

SEMICONDUCTOR DEVICE AND COMMUNICATION SYSTEM INCLUDING THE SAME

CROSS-REFERENCE TO RELATED APPLICATIONS

This application is based upon and claims the benefit of priority from Japanese patent application No. 2012-021773, filed on Feb. 3, 2012, the disclosure of which is incorporated herein in its entirety by reference.

BACKGROUND

The present invention relates to a semiconductor device and a communication system including the same, and a semiconductor device suitable for wireless baseband transmission and a communication system including the same.

There is a technique that uses electromagnetic coupling between antennas that are closely disposed relative to each other and performs data transmission between semiconductor chips respectively connected to the antennas as non-contact and high-speed baseband transmission. Such a communication method enables high-speed transmission and eliminates the need for a modulation circuit, thereby being also effective in reduction of power consumption. Note that in the wireless baseband transmission, the semiconductor chip transmits a signal to another semiconductor chip via the antenna or receives a signal transmitted from another semiconductor chip via the antenna.

Y. Yoshida et al., "A 2 Gb/s Bi-Directional Inter-Chip Data Transceiver With Differential Inductors for High Density Inductive Channel Array", IEEE JOURNAL OF SOLID-STATE CIRCUITS, 2008, VOL. 43, NO. 11, pp 2363-2369 and N. Miura et al., "A High-Speed Inductive-Coupling Link With Burst Transmission", IEEE JOURNAL OF SOLID-STATE CIRCUITS, 2009, VOL. 44, NO. 3, pp. 947-955 disclose a technique to form an antenna (inductor) in a semiconductor chip. However, in this case, as the size of the antenna is reduced (as inductance is reduced, for example), there has been a problem that the communication distance will be extremely short.

T. Takeya et al., "A 12 Gb/s Non-Contact Interface with Coupled Transmission Lines", IEEE International Solid-State Circuits Conference, Digest of Technical Papers, 2011, pp. 492-494 and Japanese Unexamined Patent Application Publication No. 2009-278051 disclose a solution to the problem. T. Takeya et al. and Japanese Unexamined Patent Application Publication No. 2009-278051 disclose a technique to form an antenna on a mounting substrate outside a semiconductor package.

In addition, Japanese Patent Nos. 3563672, 3926323, and 3877732 and Japanese Unexamined Patent Application Publication Nos. 2006-221211 and 2005-38232 disclose a technique to form an antenna in a semiconductor package.

In a high-frequency module disclosed in Japanese Patent No. 3563672, an integrated circuit chip, other electronic components, and an antenna that compose a high frequency circuit are sealed by resin mold, and only a first resin mold part for sealing the integrated circuit chip and other electronic components is covered with a metal shield case for electromagnetic shielding.

In a semiconductor device disclosed in Japanese Patent No. 3926323, a semiconductor chip is mounted on a semiconductor chip mounting member, a plurality of divided antennas are disposed around the semiconductor chip mounting member, and the semiconductor chip mounting member, the semiconductor chip, and the plurality of divided antennas are sealed by sealing resin.

A semiconductor device disclosed in Japanese Patent No. 3877732 includes a semiconductor element, a mounting part for mounting the semiconductor element, an antenna part provided to surround the mounting part via an open window part, and sealing resin. Note that a part between a cutting path where lead frames are cut after being sealed and the open window part is exposed to a side of the seal resin as an antenna part.

A semiconductor device disclosed in Japanese Unexamined Patent Application Publication No. 2006-221211 includes a semiconductor chip with a semiconductor integrated circuit and a radio tag circuit formed thereon and a semiconductor package. A conductive pattern to be an antenna is formed in this semiconductor package.

An integrated circuit device disclosed in Japanese Unexamined Patent Application Publication No. 2005-38232 includes a die pad with a rectangular integrated circuit mounted thereon, two antenna lands disposed to surround the die pad, and a separation part for the two antenna lands that are disposed in a substantially diagonal direction. Note that the die pad and the two antenna lands are composed of lead frames.

SUMMARY

However, the related arts for forming the antenna in the semiconductor package have not been able to increase the size of the antenna (increase the inductance) while suppressing the influence of electromagnetic field on the semiconductor chip from the antenna. In other words, in the related arts, it has not been possible to increase the size of the antenna in the package without deteriorating the performance of the semiconductor chip. Other issues and new features will be identified from the description in the present specification and attached drawings.

An aspect of the present invention is a semiconductor device in which a semiconductor chip is disposed in one of four regions in a semiconductor package that are sectioned by line segments connecting midpoints of two pairs of opposing sides of the semiconductor package, and a centroid of the semiconductor chip is positioned outside a closed curve that is composed of a line segment connecting by a straight line a first connection point where an antenna and a first wire are connected and a second connection point where the antenna and a second wire are connected, and a line connecting the first connection point and the second connection point along the antenna.

According to the aspect of the present invention, it is possible to provide the semiconductor device that is capable of increasing the size of the antenna in the package without deteriorating the performance of the semiconductor chip.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Figure 1:
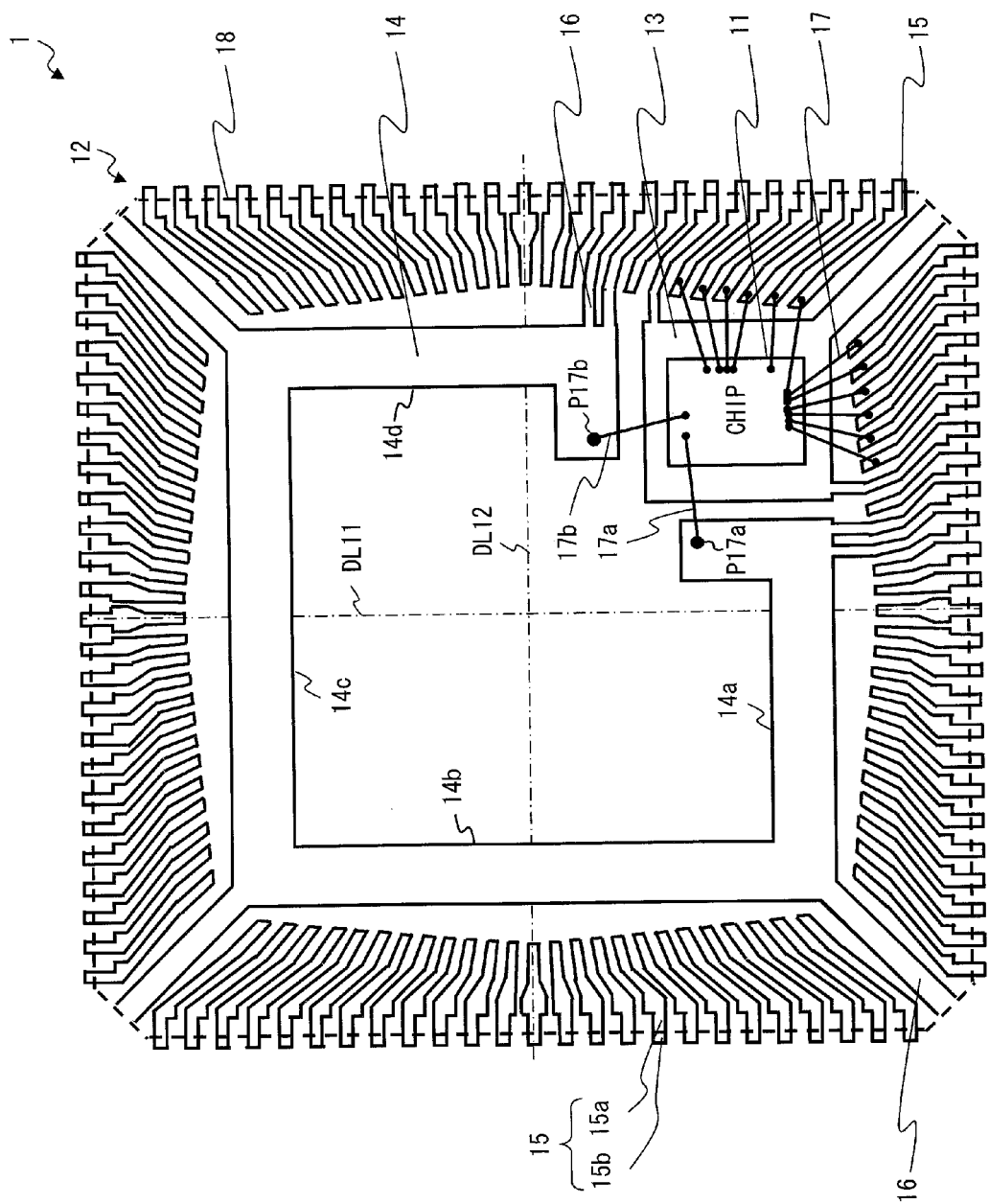
FIG. 1 is a plan view showing a semiconductor device according to a first embodiment.

Hereinafter, embodiments are explained with reference to the drawings. Note that the drawings are simplified, and the technical scope of the embodiments should not be interpreted to be limited to the drawings. Moreover, the same elements are denoted by the same reference numerals, and the explanation thereof will not be repeated.

In the following embodiments, when it is necessary to do so for convenience, the present invention will be explained in several sections or embodiments. However unless otherwise specified in particular, the sections and embodiments are not irrelevant to one another, and one thereof is in a relation of a modification, an application, a detailed explanation, a supplementary explanation, and the like of some or all of the others. Further, in the following embodiments, when reference is made to the number of elements (including the number of pieces, numeric values, quantity, and range), unless otherwise specified in particular and explicitly limited to a specific number in principle, the number of elements is not limited to a specific number and may be greater than, less than, or equal to the specific number.

Furthermore, in the following embodiments, components (including operational steps) are not necessarily required unless otherwise specified in particular or considered to be apparently required in principle. Similarly, in the following embodiments, when reference is made to shapes and a positional relationship of the components, the shapes and positional relationship shall include those that are substantially approximate or similar to the shapes and the like unless otherwise specified in particular or considered to be apparently different in principle. This applies to the abovementioned number and the like (including the number of pieces, numeric values, quantity, and range).

First Embodiment

FIG. 1 is a plan view showing a semiconductor device 1 according to a first embodiment. In the semiconductor device 1 according to this embodiment, a semiconductor chip including a transceiver circuit mounted thereon for performing wireless baseband transmission is disposed at a corner of a semiconductor package, and a centroid of the semiconductor chip is positioned outside a region surrounded by an antenna composed of a lead frame. This enables the semiconductor device 1 of this embodiment to have shorter input and output paths for signals between external connection pads (electrode pads) of the semiconductor chip and the antenna, and between the semiconductor chip and outside the semiconductor device, and also facilitates reservation of a bandwidth for these input and output paths (prevents narrowing of a bandwidth). Further, the semiconductor device 1 according to this embodiment can increase the size of the antenna in the package (increase the inductance) while suppressing the influence of electromagnetic field on the semiconductor chip from the antenna. Accordingly, the semiconductor device 1 according to this embodiment can have a relatively long communication distance for the wireless baseband transmission.

Details are Explained Below.

The semiconductor device 1 shown in FIG. 1 is composed of a semiconductor chip 11 and a semiconductor package 12. The semiconductor package 12 includes a die pad (an island where the semiconductor chip 11 is mounted) 13, an antenna 14, a plurality of lead terminals 15, a plurality of suspension leads 16, a plurality of bonding wires 17, and mold resin 18 (a substantially square part in planar view surrounded by the broken line). This embodiment explains the case in which the semiconductor package 12 is a QFP (Quad Flat Package) as an example.

All of the die pad 13, the antenna 14, the lead terminals 15, and the suspension leads 16 are composed of lead frames. The lead frame is formed by stamping or etching a copper plate, an iron plate, or a metal plate such as an alloy plate composed of nickel and iron into a predetermined shape.

Figure 12:
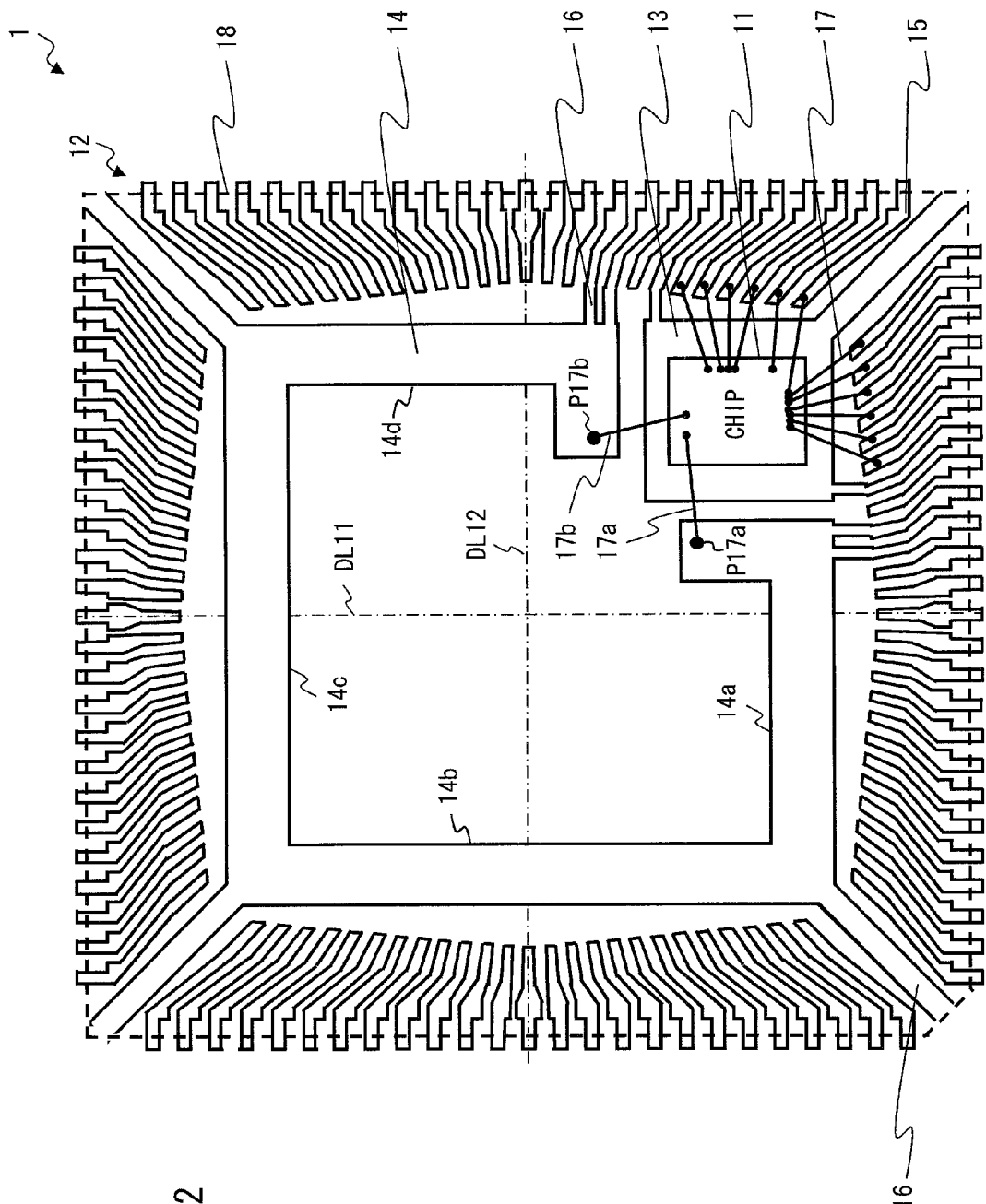
FIG. 12 is a plan view showing a modification of the semiconductor device according to the first to fourth embodiments.

An exterior of the semiconductor package 12 is formed of the mold resin 18. Therefore, a planar shape of the semiconductor package 12 is a substantially square shape like the mold resin 18. However, to be precise, corners of the mold resin 18 are chamfered, thus the planar shape of the mold resin 18 (i.e., the semiconductor package 12) is not a perfect square. The chamfered parts are sufficiently smaller than the length of four sides (four main sides) of the mold resin 18 (i.e., the semiconductor package 12). Therefore, unless specifically stated, the chamfered parts are assumed to be the corners of the mold resin 18 (i.e., the semiconductor package 12) in the following explanation. Note that as shown in FIG. 12, at least one corner among the four corners (lower left corner in this example) may be chamfered. This applies to other embodiments explained below.

Hereinafter, in regard to the four sides of the mold resin 18 (i.e., the semiconductor package 12), a topside may be referred to as a first side, a bottom side may be referred to as a second side, a left side may be referred to as a third side, and a right side may be referred to as a fourth side. Further, in regard to the four corners of the mold resin 18 (i.e., the semiconductor package 12), a lower right corner may be referred to as a first corner, a lower left corner may be referred to as a second corner, an upper left corner may be referred to as a third corner, and an upper right corner may be referred to as a fourth corner.

(Lead Terminal 15)

The lead terminals 15 are formed to project outside the four sides of the semiconductor package 12, respectively. Regarding the lead terminal 15, more specifically, a part sealed by the mold resin 18 is referred to as an inner lead 15a, and a part exposed from the mold resin 18 is referred to as an outer lead 15b. The outer lead 15b is a part connected to another semiconductor chip (not shown) mounted on a mounting substrate via wiring on the mounting substrate where the semiconductor device 12 is mounted and also is a part soldered for fixing onto the mounting substrate. That is, the outer lead 15b is a part connected to signal wiring (not shown) on the mounting substrate where an input signal to the semiconductor chip 11 propagates and the part soldered to be connected to signal wiring (not shown) on the mounting substrate where an output signal from the semiconductor chip 11 propagates. Additionally, the outer lead 15b is also a part soldered to be connected to power supply wiring (not shown) on the mounting substrate maintained at fixed potential such as power supply potential and ground potential. Therefore, unnecessary outer leads 15b may be cut off. Alternatively, the lead terminal 15 including the unnecessary outer lead 15b may not be formed from the beginning.

(Die Pad 13)

The die pad 13 is for mounting the semiconductor chip 11. The shape of the die pad 13 needs to be a shape with sufficient size to enable mounting of the semiconductor chip 11. In FIG. 1, an example is explained in which the shape of the die pad 13 is rectangular that corresponds to the rectangular semiconductor chip 11 and is slightly larger than the semiconductor chip 11. However, when the size of the after-mentioned antenna 14 is increased (when the inductance is increased), the shape of the die pad 13 is preferably as small as the semiconductor chip 11. On the other hand, in light of manufacturability at the time of mounting the semiconductor chip 11 on the die pad 13 during a sealing process of the semiconductor device 1, the size of the die pad 13 is preferably larger than that of the semiconductor chip 11. That is, the shape (size) of the die pad 13 is determined by a designer of the semiconductor device 1 in consideration of several elements such as desired antenna characteristics, a package size, and a manufacturing process margin of the package.

The die pad 13 is formed in a lower right region in FIG. 1, which is one of four regions sectioned by alternate long and short dash lines DL 11 and DL 12 in the semiconductor package 12. In connection with it, the entire the semiconductor chip 11 mounted on the die pad 13 is disposed in the lower right region in FIG. 1, which is one of the four regions sectioned by the alternate long and short dash lines DL 11 and DL 12 in the semiconductor package 12. Note that the position to form the die pad 13 is preferably as close as possible to the corner (first corner) of the semiconductor package 12 when the size of the after-mentioned antenna 14 is increased (when the inductance is increased).

Note that the alternate long and short dash line DL 11 extending in the longitudinal direction of the drawing is a line segment connecting midpoints of top and bottom two sides (first and second sides) of the semiconductor package 12 that divides the region in the semiconductor package 12 into substantially equal right and left two parts. Further, the alternate long and short dash line DL 12 extending in the traverse direction of the drawing is a line segment connecting midpoints of right and left two sides (third and fourth sides) of the semiconductor package 12 that divides the region in the semiconductor package 12 into substantially equal upper and lower two parts.

Therefore, the die pad 13 is disposed in one of the four regions sectioned by the line segments connecting the midpoints of two pairs of opposing sides of the semiconductor package 12. More specifically, the die pad 13 may mount the semiconductor chip 11 in one of the four regions divided by a line connecting midpoints of a longest side among the sides composing an outer perimeter of the semiconductor package 12 and an opposing and parallel side to the longest side, and a line connecting midpoints of a side perpendicular to the longest side and an opposing and parallel side to the side perpendicular to the longest side.

The die pad 13 is supported and fixed by some suspension leads 16. These suspension leads 16 are integrally formed with the lead terminals 15 or integrally formed with frame parts (frame parts of the lead frames respectively positioned outside of the four sides of the semiconductor package 12 before the sealing process), for instance. Although not shown, the frame parts may be integrally formed with the lead terminals 15 in addition to the suspension leads 16. Then, connection parts of the suspension leads 16, the lead terminals 15, and the frame parts are cut after encapsulating resin in the sealing process. This embodiment is primarily characterized in the arrangement of the antenna by the lead frames and the semiconductor chip, and the sealing process itself may be performed as the usual sealing process of the semiconductor device.

(Antenna 14)

The antenna 14 serves a role of one antenna among two antennas composing electromagnetic coupling element, which are described later. The semiconductor chip 11 mounted on the die pad 13 performs the wireless baseband transmission with another semiconductor chip (not shown) including the other antenna, for example, via the pair of antennas (inductors). That is, non-contact communication is performed using electromagnetic coupling of the opposing inductors. The details of the semiconductor chip 11 are explained later.

The antenna 14 is formed with a predetermined width in the region surrounded by the die pad 13 and the lead terminals 15 along the die pad 13 and the lead terminals 15 so that both ends of the antenna 14 are positioned near the die pad 13. Note that although the details are explained later, the antenna 14 has a configuration with a division formed by a slit in a part of a closed loop (i.e., a half-loop configuration). One end formed by this slit is referred to as one end of the antenna 14, and the other end formed by this slit is referred to as the other end of the antenna 14.

More specifically, the antenna 14 is composed of first to fourth antenna parts 14a to 14d.

First, the first antenna part 14a is formed in an L shape by a first antenna body and a first wire connection part.

To be more specific, the first antenna body is formed with a predetermined width in proximity to the lead terminals 15 that are formed along the bottom side (second side) of the semiconductor package 12 in substantially parallel to the bottom side (second side). Note that the one end of the first antenna body is positioned near the lower left corner (second corner) of the semiconductor package 12. Meanwhile, the other end of the first antenna body is positioned in proximity to, but not in contact with, the die pad 13.

The first wire connection part is formed extending from the other end of the first antenna body toward inside the semiconductor package 12 to be perpendicular to the first antenna body. Note that the one end of the first wire connection part is shorted to the other end of the first antenna body. Meanwhile, the other end of the first wire connection part (corresponding to the one end of the antenna 14) is positioned near the corner closest to a centroid of the semiconductor package 12 among the four corners of the die pad 13 (i.e., four corners of the semiconductor chip 11).

Next, the second antenna part 14b is formed with a predetermined width in proximity to the lead terminals 15 that are formed along the left side (third side) of the semiconductor package 12 in substantially parallel to the left side (third side). Note that the one end of the second antenna part 14b is positioned near the lower left corner (second corner) of the semiconductor package 12 and shorted to the one end of the first antenna body of the first antenna part 14a. Meanwhile, the other end of the second antenna part 14b is positioned near the upper left corner (third corner) of the semiconductor package 12.

Next, the third antenna part 14c is formed with a predetermined width in proximity to the lead terminals 15 that are formed along the top side (first side) of the semiconductor package 12 in substantially parallel to the top side (first side). Note that the one end of the third antenna part 14c is positioned near the upper left corner (third corner) of the semiconductor package 12 and shorted to the other end of the second antenna part 14b. Meanwhile, the other end of the third antenna part 14c is positioned near the upper right corner (fourth corner) of the semiconductor package 12.

Similarly, the fourth antenna part 14d is formed in an L shape by a second antenna body and a second wire connection part.

Specifically, the second antenna body is formed with a predetermined width in proximity to the lead terminals 15 that are formed along the right side (fourth side) of the semiconductor package 12 in substantially parallel to the right side (fourth side). Note that the one end of the second antenna body is positioned near the upper right corner (fourth corner) of the semiconductor package 12 and shorted to the other end of the third antenna part 14c. Meanwhile, the other end of the second antenna body is positioned in proximity to, but not in contact with, the die pad 13.

The second wire connection part is formed extending from the other end of the second antenna body toward inside the semiconductor package 12 to be perpendicular to the second antenna body. Note that the one end of the second wire connection part is shorted to the other end of the second antenna body. On the other hand, the other end of the second wire connection part (corresponding to the other end of the antenna 14) is positioned near the corner closest to the centroid of the semiconductor package 12 among the four corners of the die pad 13 (i.e., four corners of the semiconductor chip 11).

Note that the other end of the first wire connection part (corresponding to the one end of the antenna 14) and the other end of the second wire connection part (corresponding to the other end of the antenna 14) are positioned in proximity to, but not in contact with, each other.

In a similar manner as the die pad 13, the antenna 14 is supported and fixed by the suspension leads 16. These suspension leads 16 are integrally formed with the lead terminals 15 or integrally formed with frame parts (frame parts of the lead frame respectively positioned outside of the four sides of the semiconductor package 12 before the sealing process).

As mentioned above, in FIG. 1, considering that a slit is formed between 14a and 14d in FIG. 1, the antenna 14 has the configuration with a division formed by the slit in a part of the closed loop (i.e., the half-loop configuration). In other words, the antenna 14 has the half-loop configuration composed of 14a, 14b, 14c, and 14d.

The antenna 14 has two ends formed by this slit. In this specification, one end formed by this slit is referred to as the one end of the antenna 14, and the other end formed by this slit is referred to as the other end of the antenna 14.

(Semiconductor Chip 11)

The semiconductor chip 11 is mounted on the die pad 13. Therefore, the semiconductor chip 11 is disposed in one of the four regions sectioned by the line segments connecting the midpoints of two pairs of opposing sides of the semiconductor package 12. The semiconductor chip 11 includes either one of a transmission circuit and a reception circuit for performing wireless baseband transmission with another semiconductor chip (not shown). This embodiment explains, as an example, the case in which the semiconductor chip 11 includes a transmission circuit, a reception circuit, and a switch control circuit for switching transmission and reception of signals.

Figure 2:
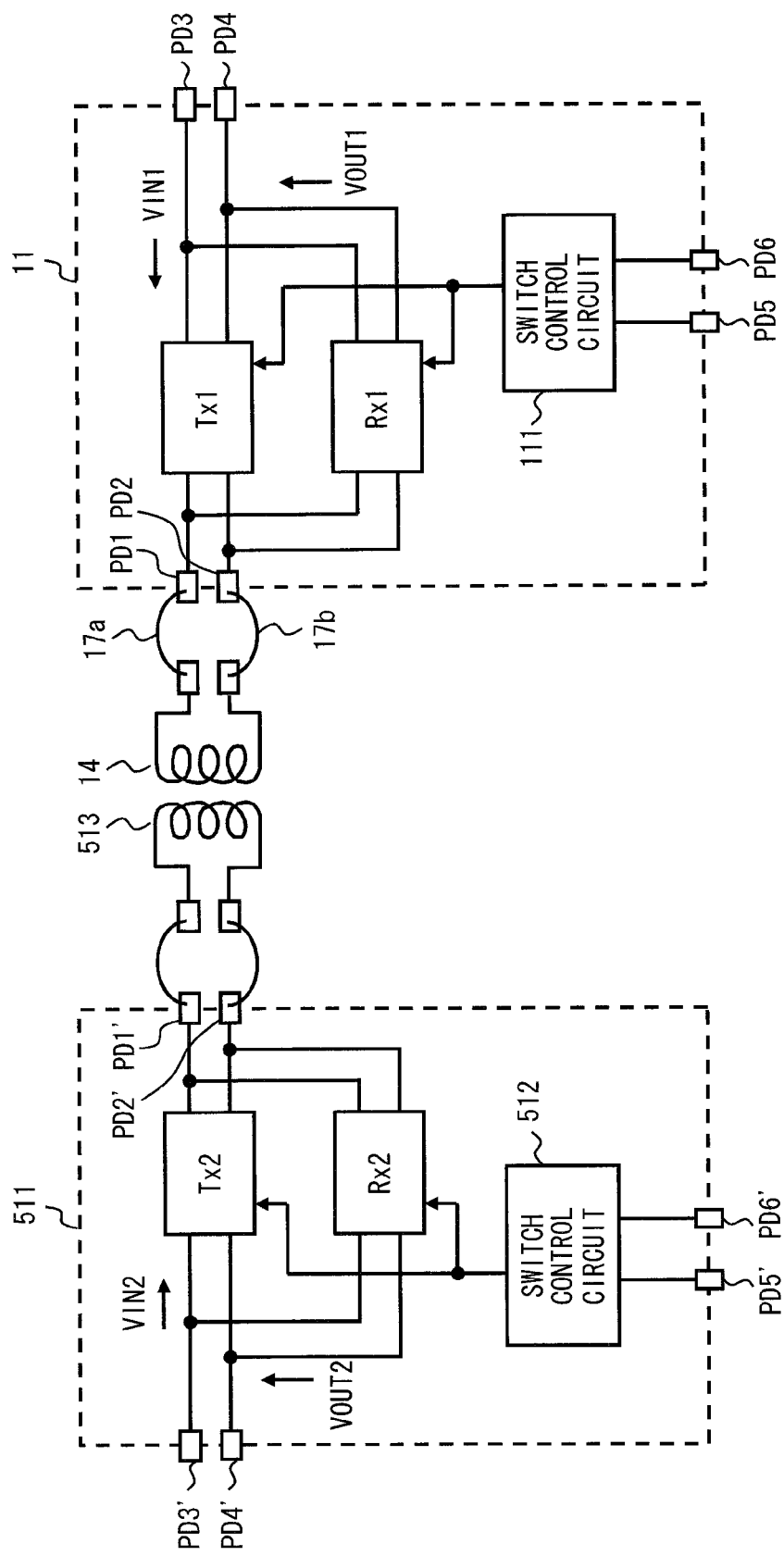
FIG. 2 shows a configuration example of a semiconductor chip according to the first embodiment.

FIG. 2 is a diagram showing an example of a circuit configuration of the semiconductor chip 11. Note that FIG. 2 illustrates the antenna 14 (one inductor) provided on the semiconductor chip 11 side, another semiconductor chip 511 to be communicated with, and an antenna 513 (the other inductor) provided on the another semiconductor chip 511 side.

The semiconductor chip 11 shown in FIG. 2 includes a transmission circuit Tx1, a reception circuit Rx1, and a switch control circuit 111. The semiconductor chip 511 includes a transmission circuit Tx2, a reception circuit Rx2, and a switch control circuit 512. Note that the switch control circuits 111 and 512 each have a function to switch an operation of the transmission circuit and the reception circuit. However, the switch control circuits 111 and 512 may have a function to change characteristics of the transmission circuits Tx1 and Tx2, and the reception circuits Rx1 and Rx2, respectively. Specifically, the switch control circuits 111 and 512 may have a function to adjust an output voltage amplitude of the transmission circuit and the reception circuit, sensitivity to an input voltage amplitude of the reception circuit, and an offset voltage of an input and output differential signal from or to the transmission circuit or the reception circuit.

In the semiconductor chip 11, one differential output terminal of the transmission circuit Tx1 and one differential input terminal of the reception circuit Rx1 are both electrically connected to an electrode pad PD1 by wiring on the chip. Moreover, in the semiconductor chip 11, the other differential output terminal of the transmission circuit Tx1 and the other differential input terminal of the reception circuit Rx1 are both electrically connected to an electrode pad PD2 by wiring on the chip.

In the semiconductor chip 11, one differential input terminal of the transmission circuit Tx1 and one differential output terminal of the reception circuit Rx1 are both electrically connected to an electrode pad PD3 by wiring on the chip. Moreover, in the semiconductor chip 11, the other differential input terminal of the transmission circuit Tx1 and the other differential output terminal of the reception circuit Rx1 are both electrically connected to an electrode pad PD4 by wiring on the chip.

The electrode pad PD1 and the one end of the antenna 14 are electrically connected by a bonding wire 17a (one of the bonding wires 17 and also referred to as a first wire). The electrode pad PD2 and the other end of the antenna 14 are electrically connected by a bonding wire 17b (one of the bonding wires 17 and also referred to as a second wire).

A control signal is supplied from outside to the switch control circuit 111 in the semiconductor chip 11 via the electrode pads PD5 and PD6. The number of electrode pads connected to these switch control circuits depends on the configuration of the switch control circuits, and may be two or more. Note that in the semiconductor chips 11 and 511, in many cases, electrode pads for supplying fixed potential such as power supply potential and ground potential are included in the above transmission circuit, the reception circuit, and the switch control circuit, however they are not illustrated in FIG. 2.

A pair of the antennas 14 and 513 (a pair of inductors) is electromagnetic coupling element that transmit and receive AC signals to and from each other. The antennas 14 and 513 are electromagnetically coupled to each other.

First, the case is explained in which the semiconductor chip 11 transmits data to the semiconductor chip 511. In this case, the switch control circuit 111 drives the transmission circuit Tx1 and stops the reception circuit Rx1 by a control signal received via the electrode pads PD5 and PD6 in the semiconductor chip 11. On the other hand, the switch control circuit 512 in the semiconductor chip 511 stops the transmission circuit Tx2 and drives the reception circuit Rx2 by a control signal received via electrode pads PD5' and PD6' in the semiconductor chip 511.

Transmission data VIN1 is input to the semiconductor chip 11 via the electrode pads PD3 and PD4 from outside the semiconductor device 1. The transmission circuit Tx1 amplifies the transmission data VIN1 (differential signal) supplied from outside the semiconductor device 1 and outputs the amplified signal as a transmission signal (differential signal). Note that the transmission circuit Tx1 may output the signal obtained by amplifying the externally input baseband signal, as described above, or may convert an externally input signal into a baseband signal and transmit the baseband signal. The antenna 14 is driven by the baseband signal (transmission signal) output from the transmission circuit Tx1 and generates the electromagnetic field according to the transmission signal. The antenna 513 generates a reception signal (differential signal) of a voltage level according to an electromagnetic field change by the antenna 14, and passes the reception signal to the reception circuit Rx2. In this way, the transmission signal output from the transmission circuit Tx1 is transmitted to the reception circuit Rx2 as the reception signal via the electromagnetic coupling element composed of the antennas 14 and 513. The reception circuit Rx2 reproduces the transmission data VIN1 based on the reception signal received from the antenna 513 and outputs the reproduced data as output data VOUT2 (differential signal). Note that the output data VOUT2 is output outside the semiconductor chip 511 via electrode pads PD3' and PD4'.

Next, the case is explained in which the semiconductor chip 11 receives data transmitted from the semiconductor chip 511. In this case, the switch control circuit 111 drives the reception circuit Rx1 and stops the transmission circuit Tx1 by a control signal received via the electrode pads PD5 and PD6 in the semiconductor chip 11. On the other hand, the switch control circuit 512 in the semiconductor chip 511 drives the transmission circuit Tx2 and stops the reception circuit Rx2 by a control signal received via the electrode pads PD5' and PD6' in the semiconductor chip 511.

The transmission circuit Tx2 provided on the semiconductor chip 511 amplifies transmission data VIN2 (differential signal) and outputs the amplified data as the transmission signal (differential signal). Note that the transmission circuit Tx2 may output the signal obtained by amplifying the externally input baseband signal, as described above, or may convert an externally input signal into a baseband signal and transmit the baseband signal. The antenna 513 is driven by a baseband signal (transmission signal) output from the transmission circuit Tx2 and generates the electromagnetic field according to the transmission signal. The antenna 14 generates the reception signal (differential signal) of a voltage level according to an electromagnetic field change by the antenna 513, and passes the reception signal to the reception circuit Rx1. In this way, the transmission signal output from the transmission circuit Tx2 is transmitted to the reception circuit Rx1 as the reception signal via the electromagnetic coupling element composed of the antennas 14 and 513. The reception circuit Rx1 reproduces the transmission data VIN2 based on the reception signal received from the antenna 14 and outputs the reproduced data as output data VOUT1 (differential signal). Note that the output data VOUT1 is output outside the semiconductor chip 11 via the electrode pads PD3 and PD4.

Note that the semiconductor chip 11 can be changed as appropriate to the circuit configuration including only one of the transmission circuit Tx1 and the reception circuit Rx1. This also applies to the semiconductor chip 511.

Figure 3:
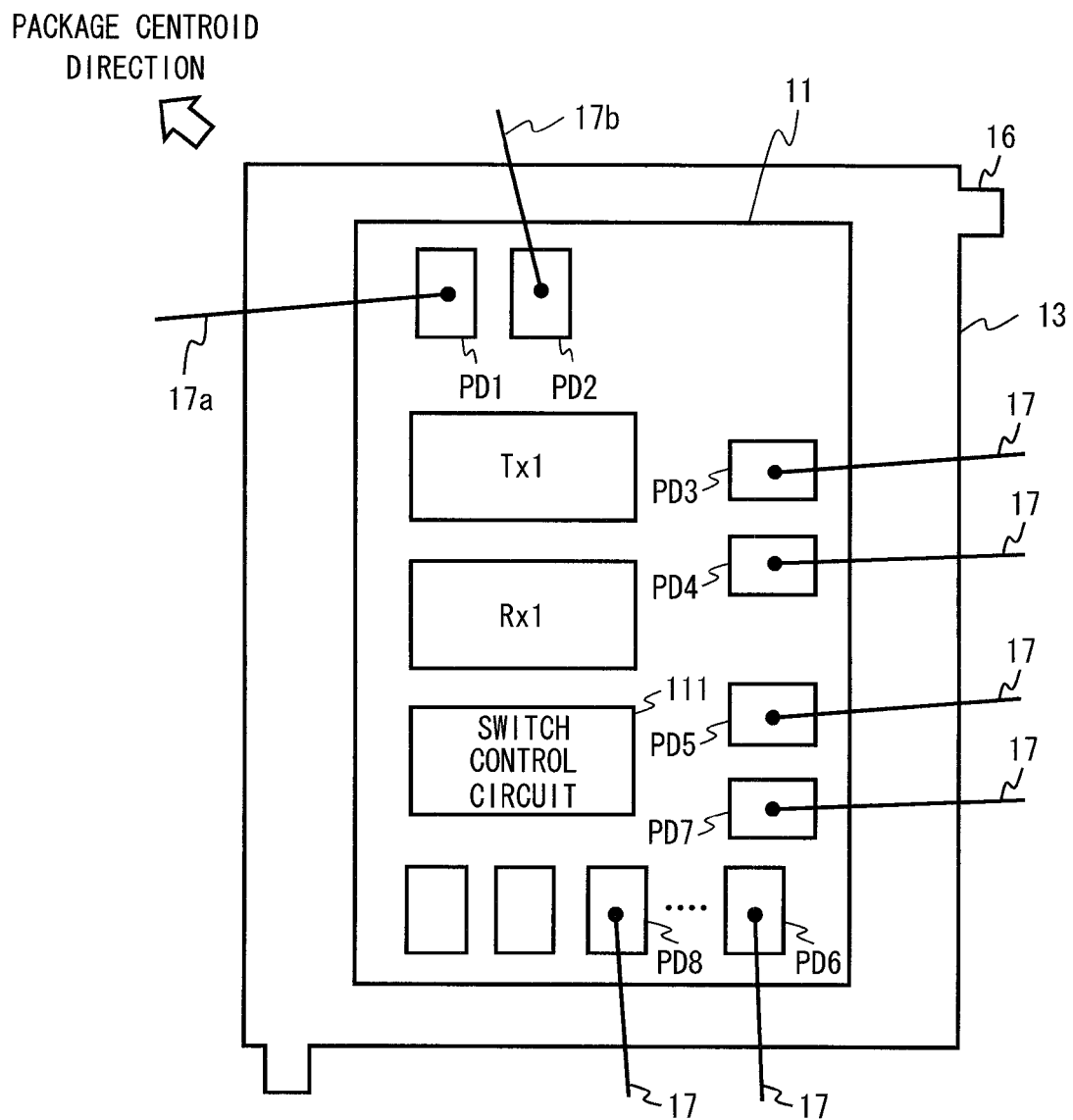
FIG. 3 is a plan view showing an example of the semiconductor chip according to the first embodiment.

FIG. 3 is a plan view schematically showing a layout configuration of the semiconductor chip 11 shown in FIG. 2. In the example of FIG. 3, the transmission circuit Tx1, the reception circuit Rx1, and the switch control circuit 111 are disposed on a central part of the semiconductor chip 11. Moreover, the plurality of electrode pads are disposed to surround the transmission circuit Tx1, the reception circuit Rx1, and the switch control circuit 111 in the periphery of the semiconductor chip 11. Note that FIG. 3 schematically shows the configuration on the layout of the semiconductor chip 11 and a connection configuration of the bonding wires to the electrode pads. Wiring connection in the semiconductor chip 11 that should be formed among the transmission circuit Tx1, the reception circuit Rx1, the switch control circuit 111, and the electrode pads PD1 to PD8 are not shown in FIG. 3. Given below is an explanation with reference to FIG. 1 in addition to FIG. 3.

The electrode pad (second electrode pad) PD2 connected to each of one output terminal of the transmission circuit Tx1 and one input terminal of the reception circuit Rx1 is disposed along at least one of the two sides (top and left sides) close to the centroid of the semiconductor package 12 among the four sides of the semiconductor chip 11 as with electrode pad PD1. In the example of FIG. 3, the electrode pad PD1 is disposed along the top side of the semiconductor chip 11. In particular, the electrode pad PD1 is disposed near the corner (upper left corner of FIG. 3) that is closest to the centroid of the semiconductor package 12 among the four corners of the semiconductor chip 11.

The electrode pad (first electrode pad) PD1 connected to each of the other output terminal of the transmission circuit Tx1 and the other input terminal of the reception circuit Rx1 is disposed along at least one of the two sides (top and left sides) close to the centroid of the semiconductor package 12 among the four sides of the semiconductor chip 11. In the example of FIG. 3, the electrode pad PD2 is disposed along the top side of the semiconductor chip 11. In particular, the electrode pad PD2 is disposed near the corner (upper left corner of FIG. 3) that is closest to the centroid of the semiconductor package 12.

Note that the electrode pads PD1 and PD2 are disposed in proximity to each other. This is because that it is generally preferable to dispose the electrode pads PD1 and PD2 in proximity to each other when two signal lines are used to transmit the differential signal. For example, another advantage of the widely-known differential transmission is the ability to cancel common mode noise. The wires for transmitting the differential signal are disposed in proximity to each other, thus noise received by the signal lines from an external environment can be eliminated by a differential circuit as common mode noise. As the signal transmitted in this embodiment is the differential signal, the electrode pads PD1 and PD2 are preferably disposed in proximity to each other, as described above.

The electrode pad PD1 and the one end of the antenna 14 are electrically connected by the bonding wire 17a (one of the bonding wires 17 and also referred to as the first wire). The electrode pad PD2 and the other end of the antenna 14 are electrically connected by the bonding wire 17b (one of the bonding wires 17 and also referred to as the second wire). Note that a point of the antenna 14 where the bonding wire 17a is connected shall be P17a, and a point of the antenna 14 where the bonding wire 17b is connected shall be P17b. The electrode pads PD1 and PD2, and the one end and the other end of the antenna 14 are disposed in proximity to one other. Therefore, the length of the bonding wires 17a and 17b are relatively short. This suppresses narrowing of the signal bandwidth in the wireless baseband transmission. Since the transmission data in the baseband wireless communication is a random bit sequence, it is necessary to transmit and receive a signal in a wider frequency bandwidth on a frequency spectrum. In this embodiment, as described above, the length of the bonding wires 17a and 17b can be made short, thus it is possible to suppress narrowing of the signal bandwidth by the bonding wires and provide a preferable configuration for transmitting and receiving the baseband signal.

Next, the electrode pad PD3 connected to each of one input terminal of the transmission circuit Tx1 and one output terminal of the reception circuit Rx1 is disposed along at least one of the two sides (right and bottom sides) that are close to outside the semiconductor device 1 among the four sides of the semiconductor chip 11. In the example of FIG. 3, the electrode pad PD3 is disposed along the right side of the semiconductor chip 11.

The electrode pad PD4 connected to each of the other input terminal of the transmission circuit Tx1 and the other output terminal of the reception circuit Rx1 is disposed along at least one of the two sides (right and bottom sides) that are close to outside the semiconductor device 1 among the four sides of the semiconductor chip 11 as with the electrode pad PD3. In the example of FIG. 3, the electrode pad PD4 is disposed along the right side of the semiconductor chip 11. Note that the electrode pad PD3 and PD4 are disposed in proximity to each other.

In addition, the electrode pads (PD5 and PD6) for supplying the control signal to the switch control circuit 111 from outside the semiconductor device 1, the electrode pads (PD7 and PD8) for supplying fixed potential such as power supply potential and grounding potential to the semiconductor chip 11, and an electrode pad for inputting and outputting a signal from and to other internal circuits are also disposed along the two sides (right and bottom side) that are close to outside the semiconductor device 1 among the four sides of the semiconductor chip 11. These electrode pads (including the electrode pads PD3 and PD4) other than the electrode pads PD1 and PD2 are respectively connected to the proximate lead terminals 15 via the bonding wires 17.

Figure 4:
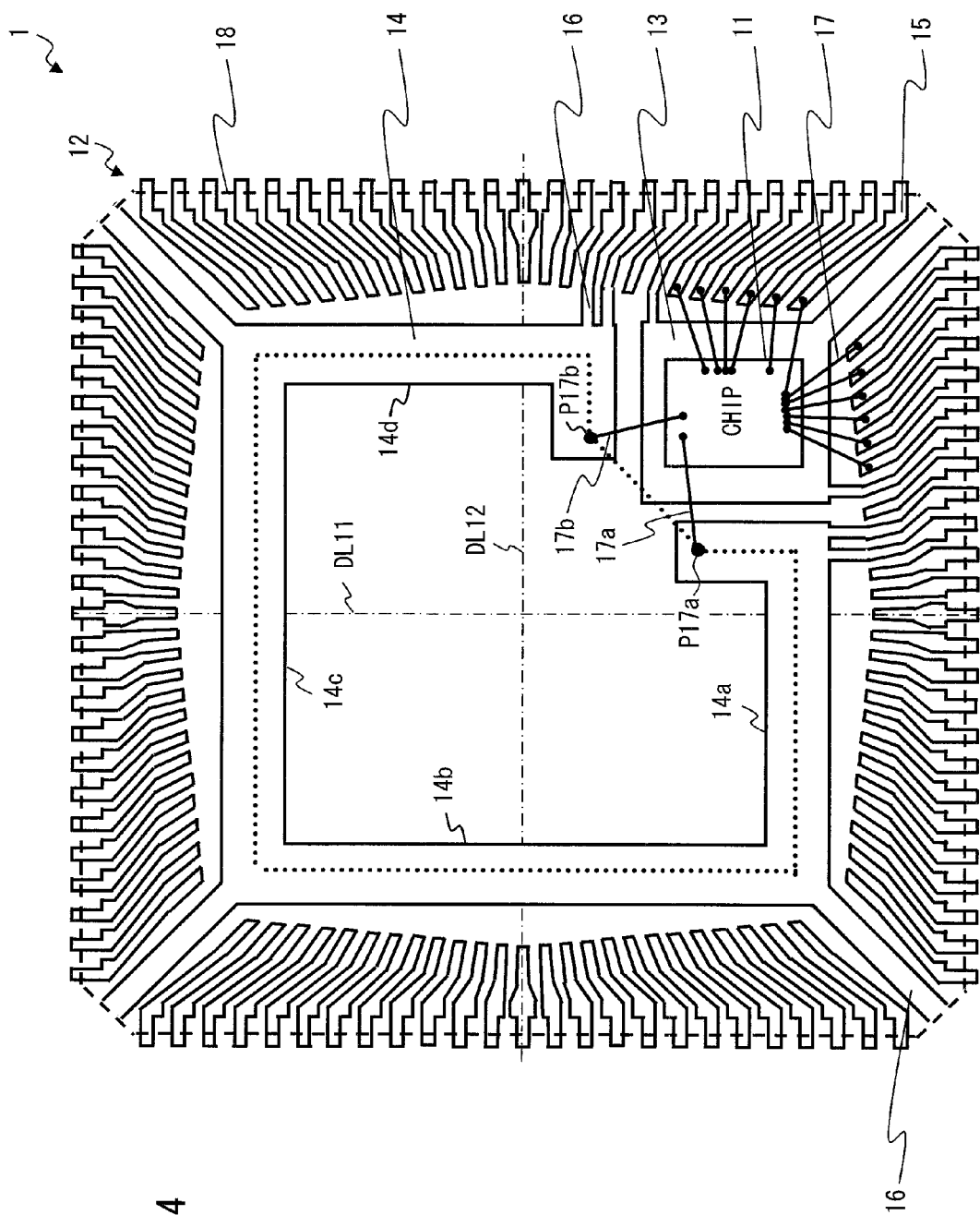
FIG. 4 explains a closed curve of the semiconductor device according to the first embodiment.

A centroid of the semiconductor chip 11 is positioned outside a closed curve that is composed of a line segment connecting the both ends of the antenna 14 by a straight line and a line on the antenna 14 connecting the both ends of the antenna 14. That is, the centroid of the semiconductor chip 11 is positioned outside the closed curve (dotted line in FIG. 4) composed of the line segment connecting the one end and the other end of the antenna 14 by the straight line and the line connecting the one end and the other end of the antenna 14 along the antenna 14. In particular, in the example of FIG. 1, the entire semiconductor chip 11 is positioned outside the closed curve. This suppresses the influence of the electromagnetic field on the semiconductor chip 11 from the antenna 14, thereby preventing malfunction of the semiconductor chip 11.

All sorts of variations can be considered for the shapes and end points of the antenna 14, however they may be at least configured in a following manner. That is, the centroid of the semiconductor chip 11 may be positioned outside the closed curve (dotted line in FIG. 4) composed of a line segment connecting by a straight line a first connection point (P17a) where the first bonding wire (17a) is connected to the antenna 14 and a second connection point (P17b) where the second bonding wire (17b) is connected to the antenna 14, and a line connecting the first connection point (P17a) and the second connection point (P17b) along the antenna 14. Note that as shown in FIG. 1, the first and second connection points (P17a and P17b) are more preferably provided at the ends of the antenna 14.

In summary, in the semiconductor device 1 according to this embodiment, the semiconductor chip 11 including the transceiver circuit for performing the wireless baseband transmission mounted thereon is disposed at the corner of the semiconductor package 12 (in one region of the four regions sectioned by the alternate long and short dash lines DL11 and DL12, to be more specific). Then, the semiconductor device 1 according to this embodiment can have shorter input and output paths for signals that are between the external connection pads (electrode pads) of the semiconductor chip and the antenna, and between the semiconductor chip and outside the semiconductor device, and also facilitates reservation of a bandwidth for these input and output paths. This further increases the size of the antenna (increases the inductance) more than in the related arts, thereby increasing the communication distance of the wireless baseband transmission to be relatively long.

Moreover, in the semiconductor device 1 according to this embodiment, the centroid of the semiconductor chip 11 is positioned outside the region surrounded by the antenna 14 (outside the closed curve, to be more specific). In particular, in the semiconductor device 1 according to this embodiment, the entire semiconductor chip 11 is positioned outside the region surrounded by the antenna 14 (outside the above closed curve, to be specific). This enables the semiconductor device 1 according to this embodiment to suppress the influence of the electromagnetic field on the semiconductor chip 11 from the antenna 14, thereby preventing malfunction of the semiconductor chip 11. That is, it is possible to suppress deterioration in the performance of the semiconductor chip 11.

Note that this embodiment explained, as an example, the case regarding the first antenna part 14a in which the first antenna body and the first wire connection part are formed to be perpendicular as an example, however it is not necessarily be perpendicular. Similarly, in regard to the fourth antenna part 14d, the case is explained as an example in which the second antenna body and the second wire connection part are formed to be perpendicular, however it is not necessarily be perpendicular.

Moreover, although not shown in FIGS. 2 and 3, the semiconductor chip 11 may include a circuit having various functions such as a calculation circuit, a clock generation circuit, a clock reproduction circuit, an AD/DA conversion circuit, a memory circuit, and a power supply circuit in addition to the transmission circuit Tx1, the reception circuit Rx1, and the switch control circuit 111. Namely, the components of the semiconductor chip 11 disclosed in this specification illustrated are only necessary configuration in order to transmit and receive the baseband signal between the semiconductor chip 11 and the semiconductor chip 511. It is obvious that the abovementioned circuits including an information processing function and a storage function may be formed in the semiconductor chips 11 and 511. For example, although not shown, a signal received from a sensor disposed outside the semiconductor device 1 may be subject to a predetermined calculation process by a calculation processing device in the semiconductor chip 11, and the information processed by the calculation processing device may be transmitted to the semiconductor chip 511 as the baseband signal.

Second Embodiment

Figure 5:
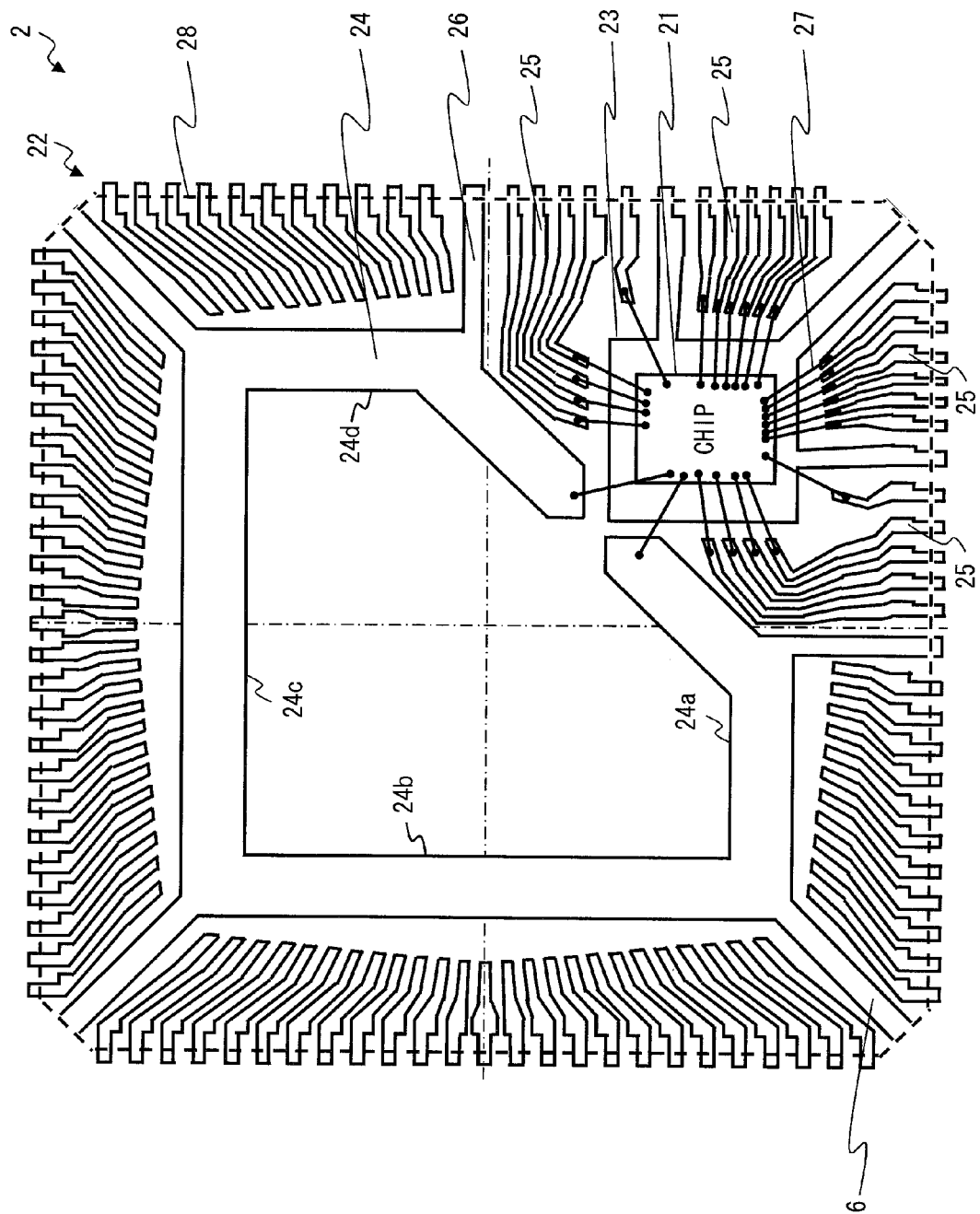
FIG. 5 is a plan view showing a semiconductor device according to a second embodiment.

FIG. 5 is a plan view showing a semiconductor device 2 according to a second embodiment. The semiconductor device 2 shown in FIG. 5 is different from the semiconductor device 1 shown in FIG. 1 in the planar shape of the antenna and the lead terminals. Hereinafter, differences from the configuration of the semiconductor device 1 shown in FIG. 1 are focused.

The semiconductor device 2 shown in FIG. 5 is composed of a semiconductor chip 21 and a semiconductor package 22. The semiconductor package 22 includes a die pad 23, an antenna 24, a plurality of lead terminals 25, a plurality of suspension leads 26, a plurality of bonding wires 27, and mold resin 28 (a substantially square part in planar view surrounded by the broken line).

Note that the semiconductor chip 21 corresponds to the semiconductor chip 11 in FIG. 1. The semiconductor package 22 corresponds to the semiconductor package 12 in FIG. 1. The die pad 23 corresponds to the die pad 13 in FIG. 1. The antenna 24 corresponds to the antenna 14 in FIG. 1. The lead terminals 25 correspond to the lead terminals 15 in FIG. 1. The suspension leads 26 correspond to the suspension leads 16 in FIG. 16. The bonding wires 27 correspond to the bonding wires 17 in FIG. 1. The mold resin 28 corresponds to the mold resin 18 in FIG. 1.

The antenna 24 is formed with a predetermined width in the region surrounded by the die pad 23 and the lead terminals 25 along the die pad 23 and the lead terminals 25 so that both ends of the antenna 24 are positioned near the die pad 23.

More specifically, the antenna 24 is composed of first to fourth antenna parts 24a to 24d. The first to fourth antenna parts 24a to 24d correspond to the first to fourth antenna parts 14a to 14d, respectively. The planar shapes of the first and fourth antenna parts of the antenna 24 are different from those of the antenna 14.

First, the first antenna part 24a is composed of a first antenna body and a first wire connection part. Specifically, the first antenna body is formed with a predetermined width in proximity to the lead terminals 25 that are formed along the bottom side (second side) of the semiconductor package 22 in substantially parallel to the bottom side (second side). Note that the one end of the first antenna body is positioned near the lower left corner (second corner) of the semiconductor package 22. Meanwhile, the other end of the first antenna body is positioned near the midpoint of the bottom side of the semiconductor package 22. That is, the other end of the first antenna body is positioned farther away from the die pad 23 than the case shown in FIG. 1.

The first wire connection part is formed extending from the other end of the first antenna body toward inside the semiconductor package 22 at approximately 135 degrees relative to the first antenna body. Note that the one end of the first wire connection part is shorted to the other end of the first antenna body. Meanwhile, the other end of the first wire connection part (corresponding to the one end of the antenna 24) is positioned near the corner closest to a centroid of the semiconductor package 22 among the four corners of the die pad 23 (i.e., the four corners of the semiconductor chip 21).

Consequently, a spatial region is formed between the first wire connection part and the die pad 23 to the extent capable of extending the lead terminals 25 to the periphery of the die pad 23.

The second antenna part 24b and the third antenna part 24c are similar to the second antenna part 14b and the third antenna part 14c, thus the explanation thereof will not be repeated.

Next, the fourth antenna part 24d is composed of a second antenna body and a second wire connection part. Specifically, the second antenna body is formed with a predetermined width in proximity to the lead terminals 25 that are formed along the right side (fourth side) of the semiconductor package 22 in substantially parallel to the right side (fourth side). Note that one end of the second antenna body is positioned near the upper right corner (fourth corner) of the semiconductor package 22 and is shorted to other end of the third antenna part 24c. On the other hand, the other end of the second antenna body is positioned near the midpoint of the right side of the semiconductor package 22. That is, the other end of the second antenna body is positioned farther away from the die pad 23 than the case shown in FIG. 1.

The second wire connection part is formed extending from the other end of the second antenna body toward inside the semiconductor package 22 at approximately 135 degrees relative to the second antenna body. Note that the one end of the second wire connection part is shorted to the other end of the second antenna body. On the other hand, the other end of the second wire connection part (corresponding to the other end of the antenna 24) is positioned near the corner closest to the centroid of the semiconductor package 22 among the four corners of the die pad 23 (i.e., four corners of the semiconductor chip 21).

Consequently, a spatial region is formed between the second wire connection part and the die pad 23 to the extent capable of extending the lead terminals 25 to the periphery of the die pad 23.

Note that the other end of the first wire connection part (corresponding to the one end of the antenna 24) and the other end of the second wire connection part (corresponding to the other end of the antenna 24) are positioned in proximity to, but not in contact with, each other.

Several (four in this example) lead terminals 25 extend in the spatial region between the first wire connection part and the die pad 23. Tips of these lead terminals 25 are positioned opposite to the left side of the semiconductor chip 21 inside the semiconductor package 22. These lead terminals 25 and the electrode pads disposed along the left side of the semiconductor chip 21 are connected via the bonding wires, respectively.

Similarly, several (four in this example) lead terminals 25 extend also in the spatial region between the second wire connection part and the die pad 23. Tips of these lead terminals 25 are positioned opposite to the top side of the semiconductor chip 21 inside the semiconductor package 22. These lead terminals 25 and the electrode pads disposed along the top side of the semiconductor chip 21 are connected via the bonding wires, respectively.

Other configurations of the semiconductor device 2 shown in FIG. 5 are similar to those of the semiconductor device 1 shown in FIG. 1, thus the explanation thereof will not be repeated.

As has been explained, in the semiconductor device 2 according to this embodiment, the spatial region is provided between the die pad 23 and the antenna 24 to the extent to enable formation of the lead terminals 25, and the lead terminals 25 are formed in the spatial region. This facilitates connection of the electrode pads of the semiconductor chip 21 inside the semiconductor package 22 and the lead terminals 25 via the bonding wires 27. That is, in the semiconductor device 2 according to this embodiment, the semiconductor chip 21 including the electrode pads disposed to all four sides is mounted to pull out outside signal lines of circuits formed on the semiconductor chip 21 and signal lines for supplying fixed potential. Note that the size of the antenna 24 at this time is almost same as the case shown in FIG. 1.

Although this embodiment explained, as an example, the case of forming the spatial regions between the first wire connection part and the die pad 23, and between the second wire connection part and the die pad 23 to the extent to enable formation of the lead terminals 25, it is not limited to this. The spatial region may be formed in either of them.

That is, in this embodiment, the semiconductor package 22 is configured to include the antenna 24, the die pad 23, and the lead terminals 25 that are composed of lead frames, and some of the lead terminals 25 are disposed between the antenna 24 and the die pad 23. This increases the number of connection terminals between the semiconductor chip 21 and outside. Moreover, the semiconductor chip 21 including the electrode pads to three sides or all four sides can be mounted.

Third Embodiment

Figure 6:
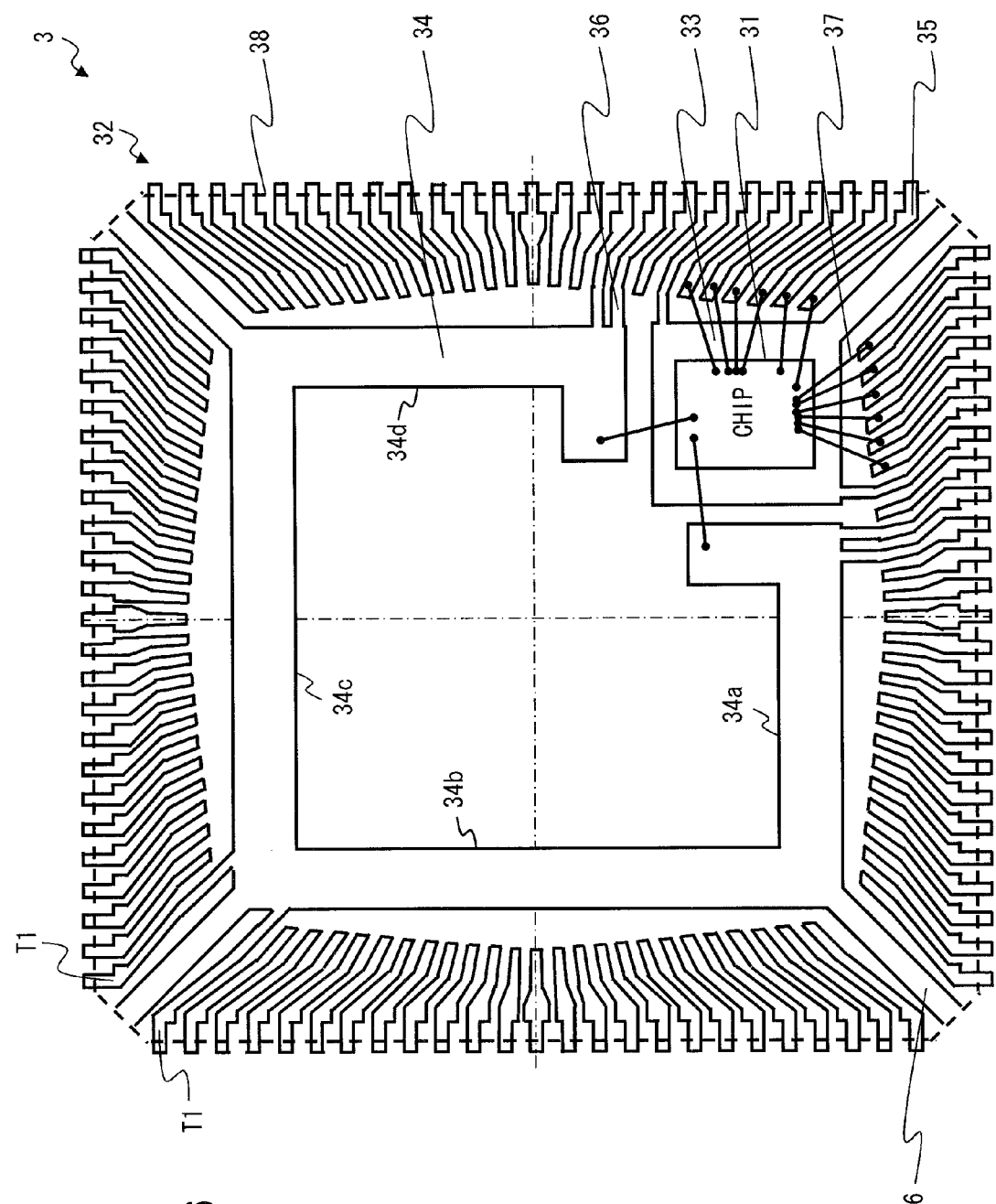
FIG. 6 is a plan view showing a semiconductor device according to a third embodiment.

FIG. 6 is a plan view showing a semiconductor device 3 according to a third embodiment. The semiconductor device 3 shown in FIG. 6 further includes a center tap to the semiconductor device 1 shown in FIG. 1. Differences from the configuration of the semiconductor device 1 shown in FIG. 1 are focused below.

The semiconductor device 3 shown in FIG. 6 is composed of a semiconductor chip 31 and a semiconductor package 32. The semiconductor package 32 includes a die pad 33, an antenna 34, a plurality of lead terminals 35, a plurality of suspension leads 36, a plurality of bonding wires 37, and mold resin 38 (a substantially square part in planar view surrounded by the broken line).

Note that the semiconductor chip 31 corresponds to the semiconductor chip 11 in FIG. 1. The semiconductor package 32 corresponds to the semiconductor package 12 in FIG. 1. The die pad 33 corresponds to the die pad 13 in FIG. 1. The antenna 34 corresponds to the antenna 14 in FIG. 1. The lead terminals 35 correspond to the lead terminals 15 in FIG. 1. The suspension leads 36 correspond to the suspension leads 16 in FIG. 1. The bonding wires 37 correspond to the bonding wires 17 in FIG. 1. The mold resin 38 corresponds to the mold resin 18 in FIG. 1.

Center tap T1 is provided to a substantially middle point (virtual grounding point) of the antenna 34. The center tap T1 is provided to part excluding both ends of the antenna 34, and more preferably, the center tap T1 is provided to the part with equal length from the both ends so that inductance components will be substantially the same. That is, more preferably, in the antenna 34, the shape between the center tap T1 and one end of the antenna 34 is substantially same as the shape between the center tap T1 and the other end of the antenna 34.

This center tap T1 is formed integrally with the lead terminal 35 using the lead frame. Fixed potential is supplied from outside to the center tap T1 via the lead terminals. This enables adjustment of a bias point from outside the semiconductor device 3.

Other configurations of the semiconductor device 3 shown in FIG. 6 are similar to those of the semiconductor device 1 shown in FIG. 1, thus the explanation thereof will not be repeated.

As has been explained, the semiconductor device 3 according to this embodiment can adjust the bias point from outside the semiconductor device 3 by the center tap capable of supplying the antenna 34 with the fixed potential from outside.

Fourth Embodiment

Figure 7:
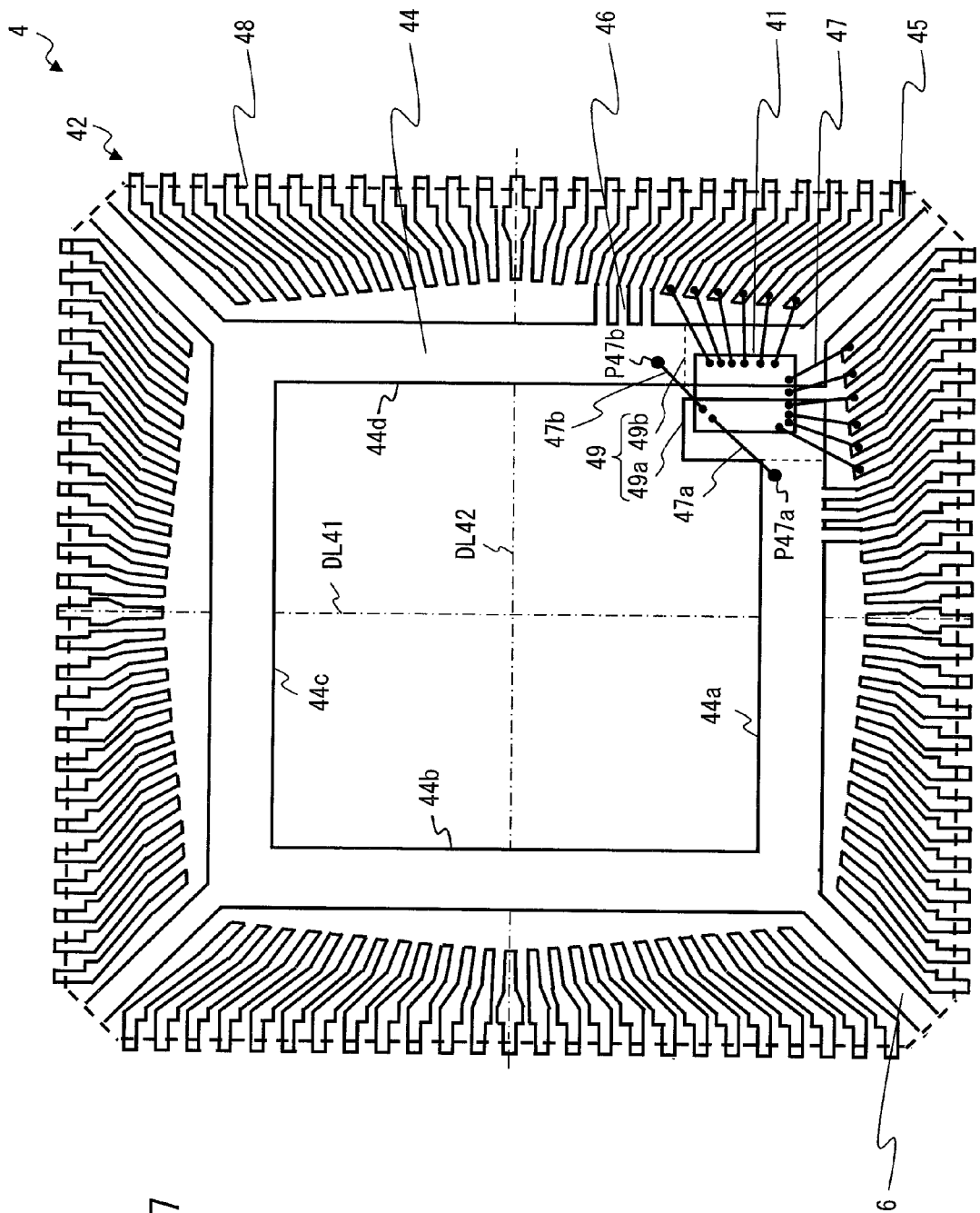
FIG. 7 is a plan view showing a semiconductor device according to a fourth embodiment.

FIG. 7 is a plan view showing a semiconductor device 4 according to a fourth embodiment. The semiconductor device 4 shown in FIG. 7 includes a chip mounting part formed extending from both ends of an antenna in place of the die pad in the semiconductor device 1 shown in FIG. 1. Differences from the configuration of the semiconductor device 1 shown in FIG. 1 are focused below.

The semiconductor device 4 shown in FIG. 7 is composed of a semiconductor chip 41 and a semiconductor package 42. The semiconductor package 42 includes an antenna 44, a chip mounting part 49 formed extending from both ends of the antenna 44, a plurality of lead terminals 45, a plurality of suspension leads 46, a plurality of bonding wires 47, and mold resin 48 (a substantially square part in planar view surrounded by the broken line).

Note that the semiconductor chip 41 corresponds to the semiconductor chip 11 in FIG. 1. The semiconductor package 42 corresponds to the semiconductor package 12 in FIG. 1. The antenna 44 corresponds to the antenna 14 in FIG. 1. The lead terminals 45 correspond to the lead terminals 15 in FIG. 1. The suspension leads 46 correspond to the suspension leads 16 in FIG. 1. The bonding wires 47 correspond to the bonding wires 17 in FIG. 1. The mold resin 48 corresponds to the mold resin 18 in FIG. 1.

The antenna 44 is formed with a predetermined width along the lead terminals 45 in the region surrounded by the lead terminals 45 so that the both ends of the antenna 44 are positioned near the place where the semiconductor chip 41 is mounted. Moreover, the chip mounting part 49 is formed integrally with the antenna 44 at the both ends of the antenna 44.

More specifically, the antenna 44 is composed of first to fourth antenna parts 44a to 44d. The first to fourth antenna parts 44a to 44d correspond to the first to fourth antenna parts 14a to 14d, respectively.

Firstly, the first antenna part 44a is formed with a predetermined width in proximity to the lead terminals 45 that are formed along the bottom side (second side) of the semiconductor package 42 in substantially parallel to the bottom side (second side). Note that one end of the first antenna part 44a is positioned near the lower left corner (second corner) of the semiconductor package 42. Meanwhile, the other end of the first antenna part 44a is positioned near the lower right corner (first corner) of the semiconductor package 42.

The first chip mounting part 49a (one chip mounting part 49) is formed extending from the other end of the first antenna part 44a toward inside the semiconductor package 42 to be perpendicular to the first antenna part 44a. This chip mounting part 49a includes the length and width to accommodate about a half of the semiconductor chip 41.

The second antenna part 44b and the third antenna part 44c are similar to the second antenna part 14b and the third antenna part 14c, thus the explanation thereof will not be repeated.

Subsequently, the fourth antenna part 44d is formed with a predetermined width in proximity to the lead terminals 45 formed along the right side (fourth side) of the semiconductor package 42 in substantially parallel to the right side (fourth side). Note that one end of the fourth antenna part 44d is positioned near the upper right corner (fourth corner) of the semiconductor package 42 and shorted to the other end of the third antenna part 44c. Meanwhile, the other end of the fourth antenna 44d is positioned near the lower right corner (first corner) of the semiconductor package 42.

The second chip mounting part 49b (the other chip mounting part 49) is formed extending straight from the other end of the fourth antenna part 44d. This chip mounting part 49b includes the length and width to accommodate about another half of the semiconductor chip 41.

Note that the first chip mounting part 49a and the second chip mounting part 49b are positioned in proximity to, but not in contact with, each other. Therefore, the both ends of the antenna 44 are not shorted. Moreover, the chip mounting part 49 composed of the first chip mounting part 49a and the second chip mounting part 49b has a shape with enough size to enable mounting of the semiconductor chip 41.

Further, the chip mounting part 49 is formed in the lower right region of FIG. 7, which is one of four regions sectioned by alternate long and short dash lines DL 41 and DL 42 in the semiconductor package 42. In connection with this, the entire semiconductor chip 41 mounted on the chip mounting part 49 is disposed in the lower right region of FIG. 7, which is one of four regions sectioned by the alternate long and short dash lines DL 41 and DL 42 in the semiconductor package 42.

Next, the semiconductor chip 41 is mounted on the chip mounting part 49 with an insulating film (not shown) interposed therebetween. For example, in the last process of the wafer formation process of the semiconductor device, an insulating film called a die attach film is attached on a rear surface of the wafer. After that, wafer dicing is performed and singulated (diced into rectangular shapes) semiconductor chip 41 is mounted on the chip mounting part 49. Specifically, the die attach film attached on the rear surface of the semiconductor chip 41 is adhered on the antenna. Then, the semiconductor chip 41 is mounted on the chip mounting part 49 with the insulating film interposed therebetween.

The electrode pad PD1 on the semiconductor chip 41 and the one end of the antenna 44 are electrically connected via the bonding wire 47a (one of the bonding wires 47). The electrode pad PD2 on the semiconductor chip 41 and the other end of the antenna 44 are electrically connected via the bonding wire 47b (one of the bonding wires 47). Note that a point of the antenna 44 where the bonding wire 47a is connected shall be P47a, and a point of the antenna 44 where the bonding wire 47b is connected shall be P47b. The electrode pads PD1 and PD2, and the one end and the other end of the antenna 44 are disposed in proximity to one another. Therefore, the length of the bonding wires 47a and 47b are relatively short. This suppresses narrowing of the signal bandwidth in the wireless baseband transmission. Since the transmission data in the baseband wireless communication is a random bit sequence, it is necessary to transmit and receive a signal in a wider frequency bandwidth on a frequency spectrum. In this embodiment, as described above, the length of the bonding wires 47a and 47b can be made short, thus it is possible to suppress narrowing of the signal bandwidth by the bonding wires and provide a preferable configuration for transmitting and receiving the baseband signal.

Other electrode pads on the semiconductor chip 41 are respectively connected to the proximate lead terminals 45 via the bonding wires 47.

Figure 8:
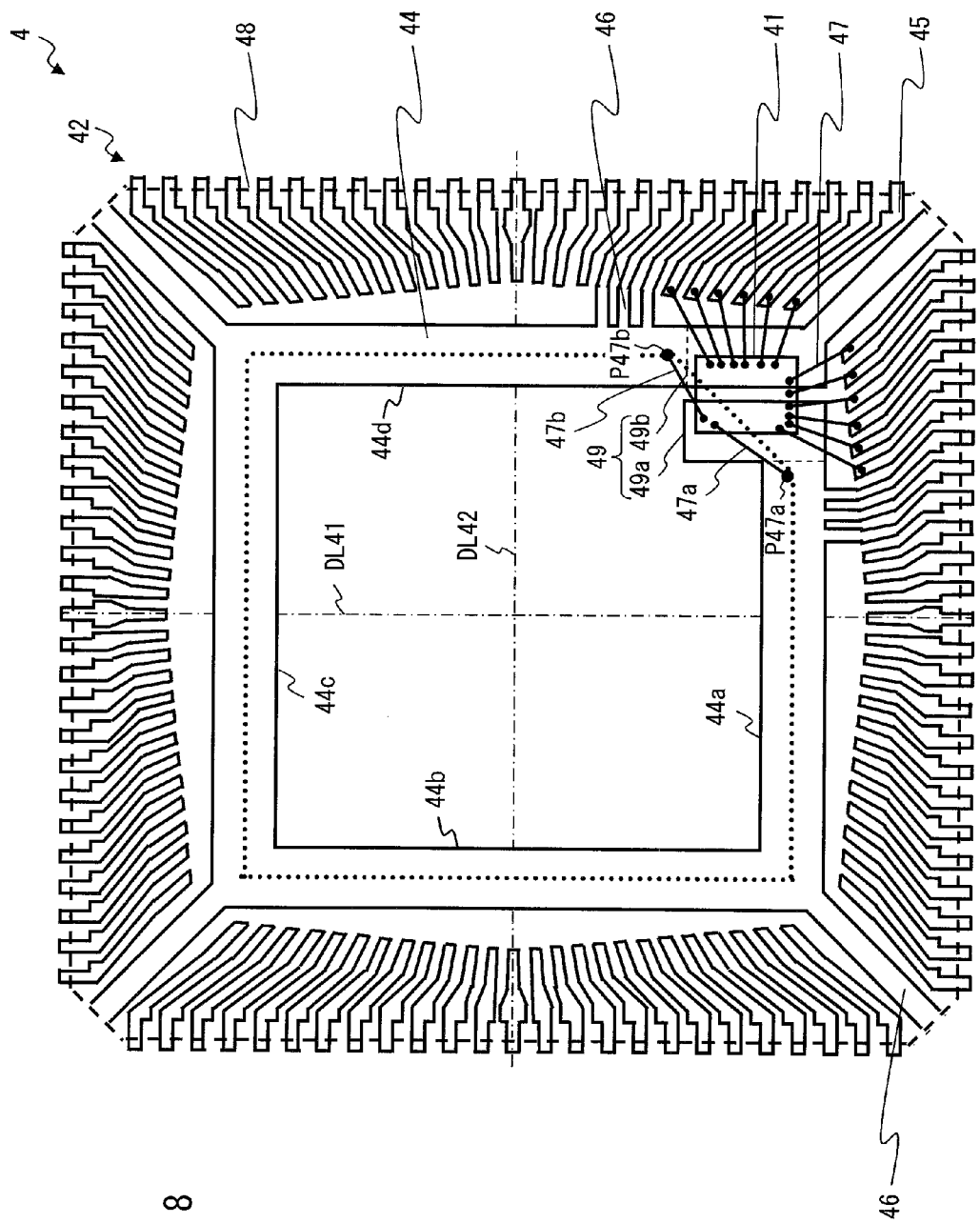
FIG. 8 explains a closed curve of the semiconductor device according to the fourth embodiment.

A centroid of the semiconductor chip 41 is positioned outside the closed curve that is composed of a line segment connecting the both ends of the antenna 44 by a straight line and a line on the antenna 44 connecting the both ends of the antenna 44. That is, the centroid of the semiconductor chip 41 is positioned outside the closed curve (dotted line in FIG. 8) composed of the line segment connecting the one end and the other end of the antenna 44 by the straight line and the line connecting the one end and the other end of the antenna 44 along the antenna 44. This suppresses the influence of the electromagnetic field on the semiconductor chip 41 from the antenna 44, thereby preventing malfunction of the semiconductor chip 41.

In a similar manner as the first embodiment, the centroid of the semiconductor chip 41 is positioned outside the closed curve (dotted line in FIG. 8) that is composed of the line segment connecting the first connection point (P47a) where the first bonding wire (47a) is connected to the antenna 44 and the second connection point (P47b) where the second bonding wire (47b) is connected to the antenna 44, and the line connecting the first connection point (P47a) and the second connection point (P47b) along the antenna 44. As in this embodiment, the first and second connection points (P47a and P47b) are more preferably provided at the ends of the antenna 44.

Other configurations of the semiconductor device 4 shown in FIG. 7 are similar to the semiconductor device 1 shown in FIG. 1, thus the explanation thereof will not be repeated.

Accordingly, the semiconductor device 4 according to this embodiment can achieve equivalent advantages as the semiconductor device 1 shown in FIG. 1. Further, the semiconductor device 4 according to this embodiment does not include the die pad, thus the size of the antenna can be larger than in the semiconductor device 1 shown in FIG. 1. Thus, the semiconductor device 4 according to this embodiment can further increase the communication distance of the wireless baseband transmission.

(First Modification of the Semiconductor Device 4)

Figure 9:
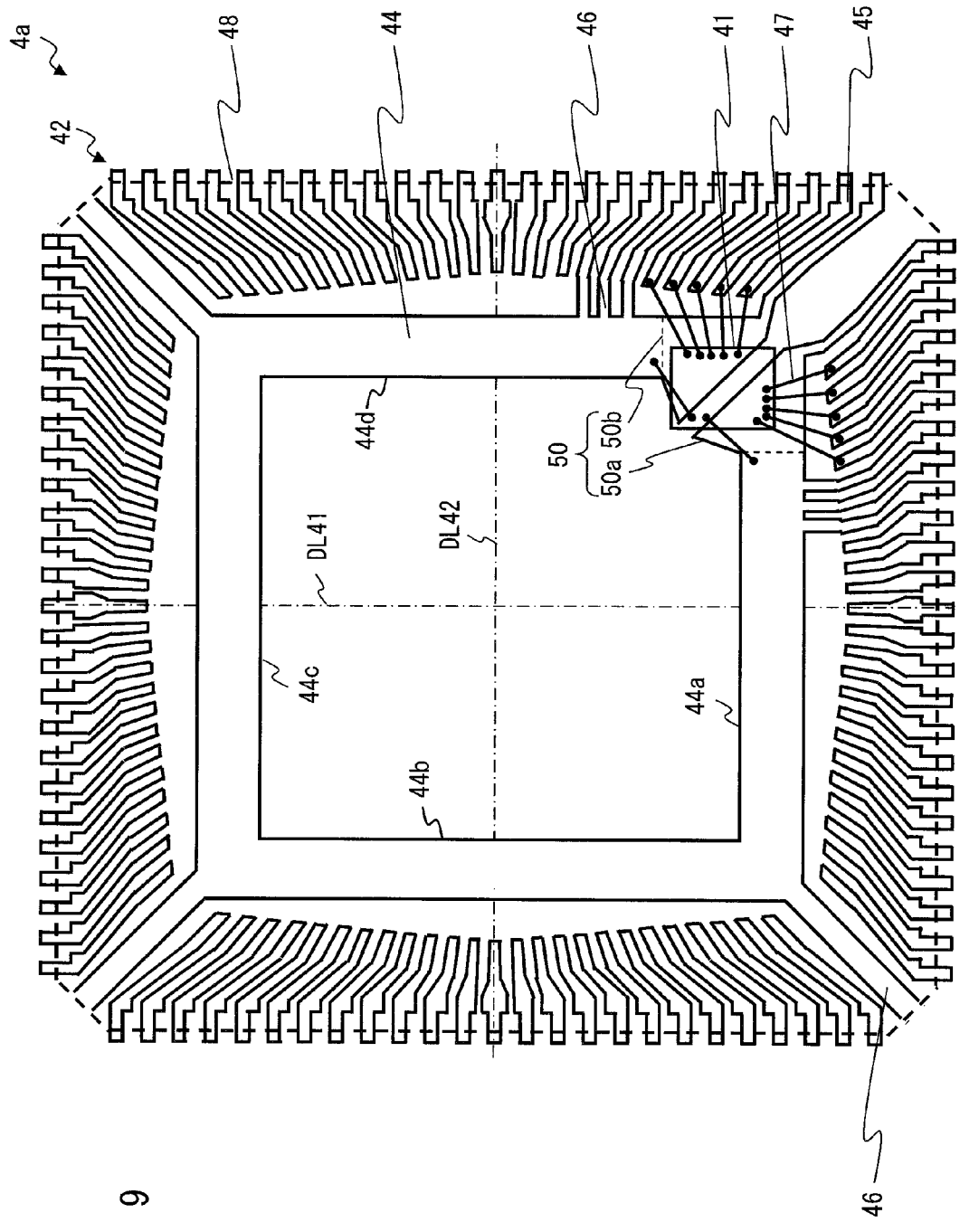
FIG. 9 is a plan view showing a modification of the semiconductor device according to the fourth embodiment.

FIG. 9 is a plan view showing a semiconductor device 4a as a modification of the semiconductor device 4 shown in FIG. 7. The semiconductor device 4a shown in FIG. 9 includes a chip mounting part 50 in place of the chip mounting part 49 of the semiconductor device 4 shown in FIG. 7. Other configurations of the semiconductor device 4a shown in FIG. 9 are similar to those of the semiconductor device 4 shown in FIG. 7. Therefore, other components of the semiconductor device 4a shown in FIG. 9 are denoted by the same reference numerals as those of the semiconductor device 4 shown in FIG. 7, and the explanation thereof will not be repeated.

The chip mounting part 50 is composed of a first chip mounting part 50a and a second chip mounting part 50b. The first chip mounting part 50a is formed extending from the other end of the first antenna part 44a (corresponding to the one end of the antenna 44). The second chip mounting part 50b is formed extending from the other end of the fourth antenna part 44d (corresponding to the other end of the antenna 44). In other words, the first chip mounting part 50a is integrally formed with the other end of the first antenna part 44a (corresponding to the one end of the antenna 44). The second chip mounting part 50b is integrally formed with the other end of the fourth antenna part 44d (corresponding to the other end of the antenna 44). The first chip mounting part 50*a* and the second chip mounting part 50*b* are formed with a predetermined interval therebetween.

Moreover, the opposing sides of the first chip mounting part 50*a* and the second chip mounting part 50*b* are substantially parallel to a diagonal line connecting the corner (first corner) closest to the semiconductor chip 41 and the opposing corner (third corner) among the four corners of the semiconductor package 42.

Note that the chip mounting part 50 may have any configuration as long as the chip mounting part 50 has a shape with enough size to enable mounting of the semiconductor chip 41 without making the first chip mounting part 50*a* and the second chip mounting part 50*b* in contact with each other.

(Second Modification of the Semiconductor Device 4)

Figure 10:
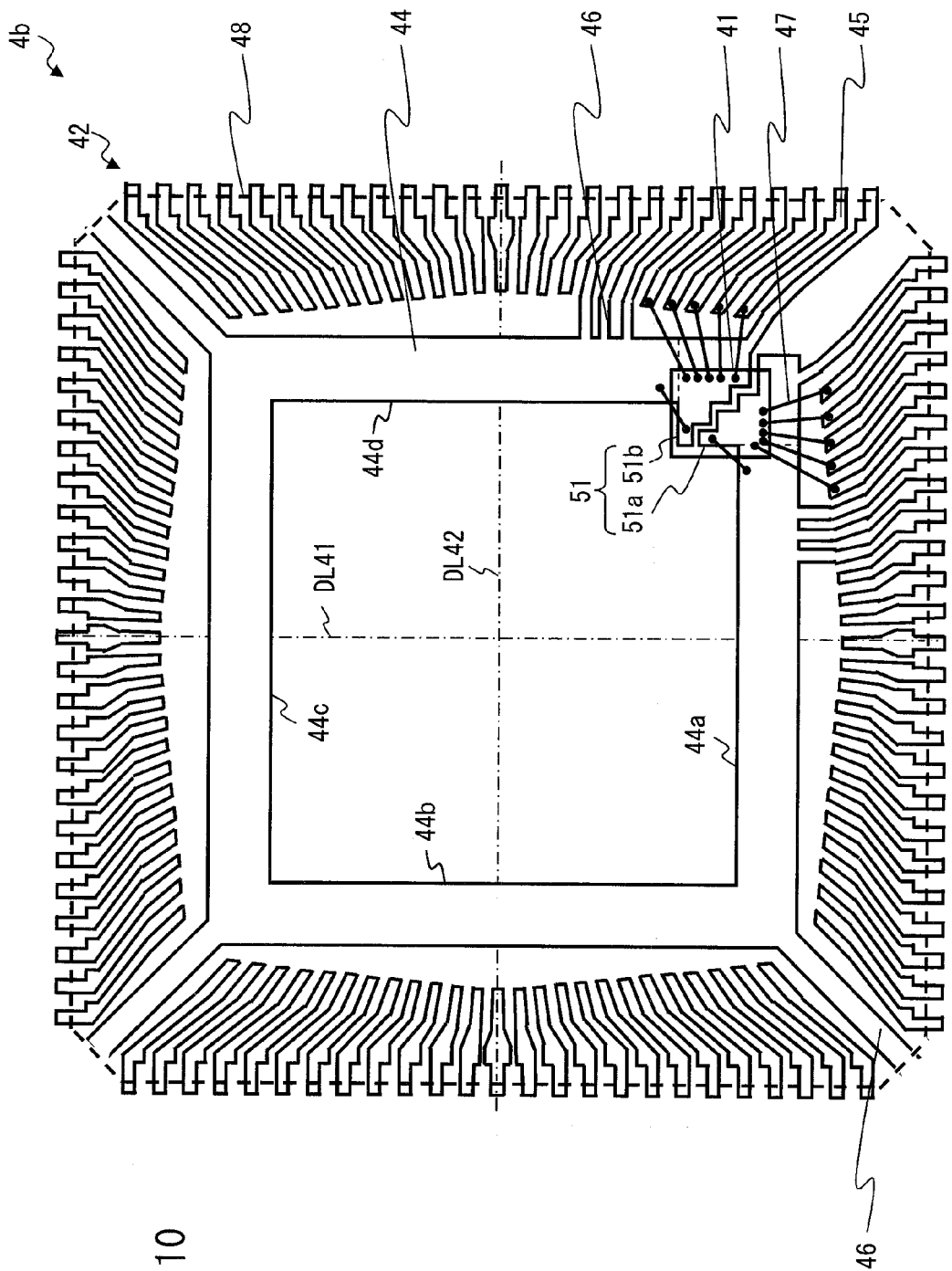
FIG. 10 is a plan view showing a modification of the semiconductor device according to the fourth embodiment.

FIG. 10 is a plan view showing a semiconductor device 4*b* as a modification of the semiconductor device 4 shown in FIG. 7. The semiconductor device 4*b* shown in FIG. 10 includes a chip mounting part 51 in place of the chip mounting part 49 of the semiconductor device 4 shown in FIG. 7. Other configurations of the semiconductor device 4*b* shown in FIG. 10 are similar to those of the semiconductor device 4 shown in FIG. 7. Therefore, other components of the semiconductor device 4*b* shown in FIG. 10 are denoted by the same reference numerals as those of the semiconductor device 4 shown in FIG. 7, and the explanation thereof will not be repeated.

The chip mounting part 51 is composed of a first chip mounting part 51*a* and a second chip mounting part 51*b*. The first chip mounting part 51*a* is formed extending from the other end of the first antenna part 44*a* (corresponding to the one end of the antenna 44). The second chip mounting part 51*b* is formed extending from the other end of the fourth antenna part 44*d* (corresponding to the other end of the antenna 44). In other words, the first chip mounting part 51*a* is integrally formed with the other end of the first antenna part 44*a* (corresponding to the one end of the antenna 44). The second chip mounting part 51*b* is integrally formed with the other end of the fourth antenna part 44*d* (corresponding to the other end of the antenna 44). The first chip mounting part 51*a* and the second chip mounting part 51*b* are formed with a predetermined interval therebetween.

Moreover, the opposing sides of the first chip mounting part 51*a* and the second chip mounting part 51*b* are substantially parallel to the diagonal line connecting the corner (first corner) closest to the semiconductor chip 41 and the opposing corner (third corner) among the four corners of the semiconductor package 42. Further, the opposing sides of the first chip mounting part 51*a* and the second chip mounting part 51*b* are configured in consecutive steps (zigzag form).

Note that the chip mounting part 51 may have any configuration as long as the chip mounting part 51 has a shape with enough size to enable mounting of the semiconductor chip 51 without making the first chip mounting part 51*a* and the second chip mounting part 51*b* in contact with each other.

In the examples shown in FIGS. 7, 9, and 10, the semiconductor package 42 further includes the first chip mounting part (49*a*, 50*a*, and 51*a*) formed integrally with the one end of the antenna 44 for mounting a part of the semiconductor chip 41, and the second chip mounting part (49*b*, 50*b*, and 51*b*) formed integrally with the other end of the antenna 44 with a predetermined interval between the first chip mounting part for mounting another part of the semiconductor chip 41.

Note that in these examples, the first chip mounting part (49*a*, 50*a*, and 51*a*) and the second chip mounting part (49*b*, 50*b*, and 51*b*) are not necessarily formed at the both ends of the antenna 44 but may be formed at a part of the antenna 44. The chip mounting part (49, 50, and 51) is divided into two regions (i.e., the first and second chip mounting parts) by slit.

That is, the semiconductor package 42 includes the chip mounting part (49, 50, and 51) that is integrally formed with the antenna 44. The chip mounting part is divided into two regions by the slit and configured to mount the semiconductor chip 41 in the region with insulating material interposed therebetween.

Note that as illustrated in this embodiment, the first and second chip mounting parts are preferably formed to the closest possible positions to the one end and the other end of the antenna, respectively. This increases the inductance of the antenna 44.

In FIGS. 9 and 10, these slits are substantially parallel to the diagonal lines connecting the corner closest to the semiconductor chip among the four corners of the semiconductor package 42 and the opposing corner. In FIG. 10 the slit is in a zigzag form.

(Third Modification of the Semiconductor Device 4)

Figure 11:
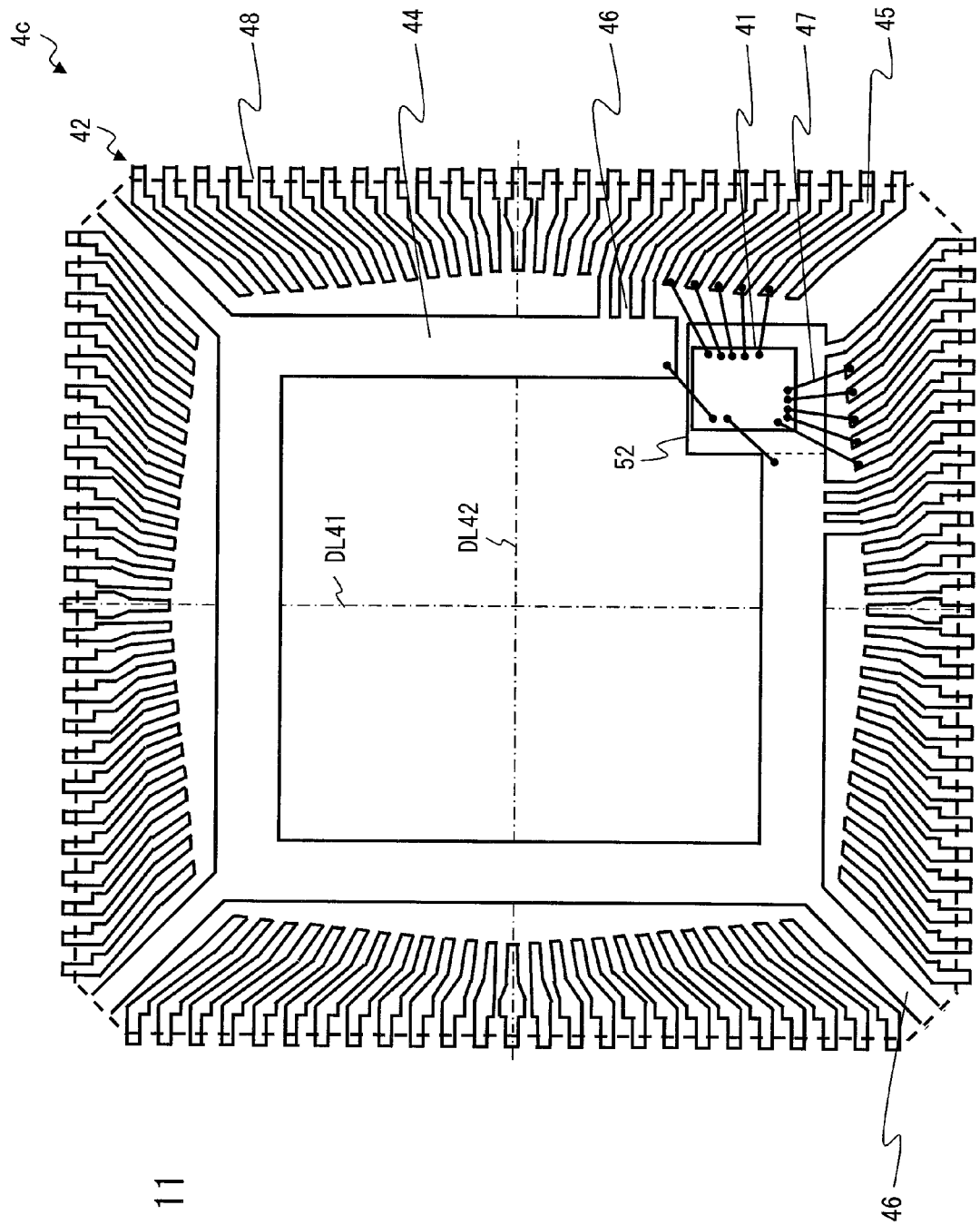
FIG. 11 is a plan view showing a modification of the semiconductor device according to the fourth embodiment.

FIG. 11 is a plan view showing a semiconductor device 4*c* as a modification of the semiconductor device 4 shown in FIG. 7. The semiconductor device 4*c* shown in FIG. 11 includes a chip mounting part 52 in place of the chip mounting part 49 of the semiconductor device 4 shown in FIG. 7. Other configurations of the semiconductor device 4*c* shown in FIG. 11 are similar to those of the semiconductor device 4 shown in FIG. 7. Therefore, other components of the semiconductor device 4*c* shown in FIG. 11 are denoted by the same reference numerals as those of the semiconductor device 4 shown in FIG. 7, and the explanation thereof will not be repeated.

The first chip mounting part 52 is formed extending from the other end of the first antenna part 44*a* (corresponding to the one end of the antenna 44). In other words, the chip mounting part 52 is integrally formed with the other end of the first antenna part 44*a* (corresponding to the one end of the antenna 44). This chip mounting part 52 has a shape with enough size to enable mounting of the semiconductor chip 41. Note that this chip mounting part 52 is not in contact with the other end of the fourth antenna part 44*d* (corresponding to the other end of the antenna 44).

Note that the chip mounting part 52 may have any configuration as long as the chip mounting part 52 is integrally formed with one of the one end and the other end of the antenna 44, the chip mounting part 52 is formed with a predetermined interval from remaining one of the one end and the other end of the antenna 44, and has a shape with enough size to enable mounting of the semiconductor chip 41.

That is, the semiconductor device 4*c* further includes the chip mounting part 52 for mounting the semiconductor chip 41 that is integrally formed with one of the one end and the other end of the antenna 44 and also formed with a predetermined interval from remaining one of the one end and the other end of the antenna 44.

Note that the chip mounting part 52 may not be necessarily formed at the end of the antenna 44 but may be formed at a part of the antenna 44.

That is, the semiconductor package 42 is configured to include the chip mounting part 52 that is formed integrally with the antenna 44 and to mount the semiconductor chip 41 on the chip mounting part 52 with insulating material interposed therebetween.

Note that as illustrated in this embodiment, the chip mounting part 52 is preferably formed at a position closest possible to the end of the antenna 44. This increases the inductance of the antenna 44.

(Differences Between the Semiconductor Device According to the Above Embodiments and the Related Arts)

Given below is an explanation of the differences between the semiconductor device according to the above embodiments and the related arts.

In the related arts for forming the antenna in the semiconductor package, it has been difficult to maximize the size of the antenna using the region in the package and favorably transmit baseband signals at Gbps data rate. Specifically, with the antenna in the package according to the related arts, bonding wires are longer between the external connection pad of the semiconductor chip and the antenna, and between the external connection pads of the semiconductor chip and the external connection pins of the package. This has led to a problem of narrowing the bandwidth of the transmission path where signals propagate, and thereby deteriorating the quality of baseband transmission for transmitting and receiving random data. Further, it has been difficult to increase the size of the antenna (increase the inductance) while suppressing the influence of the electromagnetic field on the semiconductor chip from the antenna. In other words, in the related arts, it has been difficult to reserve a bandwidth for external connection pins to be pulled out from the semiconductor chip and the semiconductor package for favorable baseband transmission, and also difficult to achieve both the reduction in the cost by a small package size and the increase in the antenna size for improving the baseband transmission performance between the antennas. Furthermore, it has not been possible to increase the size of the antenna in the package without deteriorating the performance of the semiconductor chip. Explained below are detailed differences between the related arts disclosed in each patent literature and the semiconductor device according to the above embodiments.

First, in the semiconductor device disclosed in Japanese Unexamined Patent Application Publication No. 2009-278051, the antenna is formed on the mounting substrate outside the semiconductor package. On the other hand, in the semiconductor device according to the above embodiments, the antenna is formed in the semiconductor package. That is, the configuration of the antennas is completely different in the first place.

Note that in the semiconductor device disclosed in Japanese Unexamined Patent Application Publication No. 2009-278051, a part of the antenna is formed also inside the semiconductor package. However, the semiconductor device according to this related art mounts the semiconductor chip in the center of the semiconductor package, thus the size of the antenna in the semiconductor package cannot be increased.

When the antenna size is increased with the technique disclosed in Japanese Unexamined Patent Application Publication No. 2009-278051, the package size will increase accordingly, and so will the cost. Moreover, when the antenna is formed to surround the semiconductor chip in an attempt to increase the antenna size, the performance of the semiconductor chip deteriorates due to the influence of the electromagnetic field generated by the antenna. In short, the semiconductor device of this related art is unable to increase the antenna size without deteriorating the performance of the semiconductor chip.

Moreover, in the configurations disclosed in Japanese Patent No. 3877732 and Japanese Unexamined Patent Application Publication Nos. 2006-221211 and 2005-38232, the semiconductor chip is mounted in the center of the semiconductor package, and the antenna is formed to surround the semiconductor chip. Therefore, the input and output paths for signals between the external connection pads (electrode pads) of the semiconductor chip and the antenna, and between the semiconductor chip and outside the semiconductor device become relatively long, thereby making it difficult to reserve the bandwidth for these input and output paths. Moreover, the performance of the semiconductor chip deteriorates due to the influence of the electromagnetic field generated by the antenna. In other words, the configurations in these related arts are unable to increase the antenna size in the package without deteriorating the performance of the semiconductor chip. In particular, in the configuration disclosed in Japanese Unexamined Patent Application Publication No. 2006-221211, the die pad is completely included in the inner diameter of the antenna. In order to manufacture the semiconductor device having such a configuration, it is necessary to electrically separate the die pad and the antenna coil before cutting lead frames, thus the die pad must be supported using an insulating support in the sealing process. This increases the manufacturing cost.

Moreover, the high frequency module disclosed in Japanese Patent No. 3563672 mounts the semiconductor chip near the midpoint of one side of the semiconductor package, thus the antenna size in the semiconductor package cannot be increased. In other words, the area that can be used as the antenna is small in the total area of the package.

In addition, in the semiconductor device disclosed in Japanese Patent No. 3926323, a plurality of divided antennas formed of the lead frames are electrically connected via the semiconductor chip. For this reason, current flows through the adjacent wires on the antenna that is in reverse phase to each other and negative mutual inductance is generated, thereby reducing the inductance of the antenna coil. That is, the inductance per unit area is reduced, and the package size must be increased in order to achieve a desired inductance value, and this increases the cost.

Meanwhile, in the semiconductor device according to the above embodiments, the semiconductor chip is disposed at the corner of the semiconductor package (see above for more details), and the centroid of the semiconductor chip is positioned outside the region surrounded by the antenna composed of the lead frames (see above for more details). This enables the semiconductor package according to the above embodiments to increase the antenna size in the package without deteriorating the performance of the semiconductor package better than in the related arts. Further, it is not necessary for the semiconductor device according to the above embodiments to support the die pad using insulating suspension leads, thus the increase in the manufacturing cost can be prevented.

Next, in the wireless baseband transmission, generally the differential signals are used to perform accurate signal exchanging. The baseband transmission further needs to prevent narrowing of the signal bandwidth and transmit broadband signals. Therefore, it is necessary to dispose the electrode pads (corresponding to PD1 and PD2) for inputting and outputting the differential signals and the both ends of the antenna proximately, and further to have as short bonding wires as possible. However, in the configurations disclosed in Japanese Unexamined Patent Application Publication No. 2009-278051, Japanese Patent Nos. 3563672 and 3877732, and Japanese Unexamined Patent Application Publication Nos. 2006-221211 and 2005-38232, the length of the bonding wires is relatively long due to the reasons such as both ends of the antenna are distant, and this narrows the signal bandwidth.

In general wireless communication using a wireless modulation technique, a matching circuit may be included to obtain a gain only by a frequency of a carrier to use. However, in the wireless baseband transmission, the random data is transmitted as mentioned before, thus the transmission signal has a broadband spectrum on a frequency axis. Therefore, the signal band of signal pins for inputting and outputting signals with the antenna and an external information processing device must be wide range frequency band. When the signal bandwidth is narrowed as in the above related arts, accurate transmission of baseband signals may not be performed.

On the other hand, in the semiconductor device according to this embodiment, as the electrode pads (corresponding to PD1 and PD2) for inputting and outputting the differential signals with the antenna and the both ends of the antenna are disposed proximately, such a problem will not be generated.

Additionally, in the configuration disclosed in Japanese Unexamined Patent Application Publication No. 2005-38232, signals of the semiconductor chip are input and output only via the antenna. On the other hand, in the semiconductor device according to the above embodiments, signal transmission and reception between the semiconductor chips are performed via the antenna, however input of the transmission signal to the semiconductor chip and output of the reception signal outside the semiconductor chip may be performed by a wired connection. Therefore, the semiconductor device according to the above embodiments is capable of favorably transmitting information to the semiconductor chips 11 and 511, and the information processing device positioned outside the semiconductor device 1, which is not considered in Japanese Unexamined Patent Application Publication No. 2005-38232.

As mentioned above, in the semiconductor device according to the first to fourth embodiments, the semiconductor chip including the transceiver circuit for performing the wireless baseband transmission is disposed at the corner of the semiconductor package 12. This enables the semiconductor devices according to the first to fourth embodiments to reduce the length of the input and output paths for signals between the external connection pads (electrode pad) of the semiconductor chip and the antenna, and between the semiconductor chip and outside the semiconductor device, and also facilitates reservation of the bandwidth for these input and output paths. Moreover, since the size of the antenna in the package can be increased more than in the related arts, the communication distance for the wireless baseband transmission can be relatively long.

Further, in the semiconductor devices according to the first to fourth embodiments, the centroid of the semiconductor chip is positioned outside the region surrounded by the antenna (outside the above closed curve, to be specific). This enables the semiconductor devices according to the above embodiments to suppress the influence of the electromagnetic field on the semiconductor chip from the antenna, thereby preventing malfunction of the semiconductor chip. Therefore, it is possible to prevent the deterioration of the performance of the semiconductor chip.

Furthermore, in the semiconductor device according to the first to fourth embodiments, in the manufacturing process therefor, the antenna and the die pad are supported using the suspension leads integrally formed with the lead terminals without using the insulating support. This eliminates the need for the insulating support and suppresses the increase in the manufacturing cost. Moreover, as the antenna and the die pad can be firmly fixed using the suspension leads integrally formed with the lead terminals, the yield of the wire bonding can be improved.

For example, in such a communication system where a pair of semiconductor devices is disposed opposite to each other, the area where the antennas face each other can be increased, and thus increasing the amplitudes of the reception signals as well. In other words, the signal amplitude output from the transmission circuit can be made small in order to achieve desired signal amplitude on the receiver side. That is, the power consumption of the transmission circuit can be reduced.

Although the present invention made by the inventor is explained in detail based on the embodiments, the present invention is not limited to the above embodiments, but it is obvious that various modifications can be made within the scope of the present invention.

Figure 13:
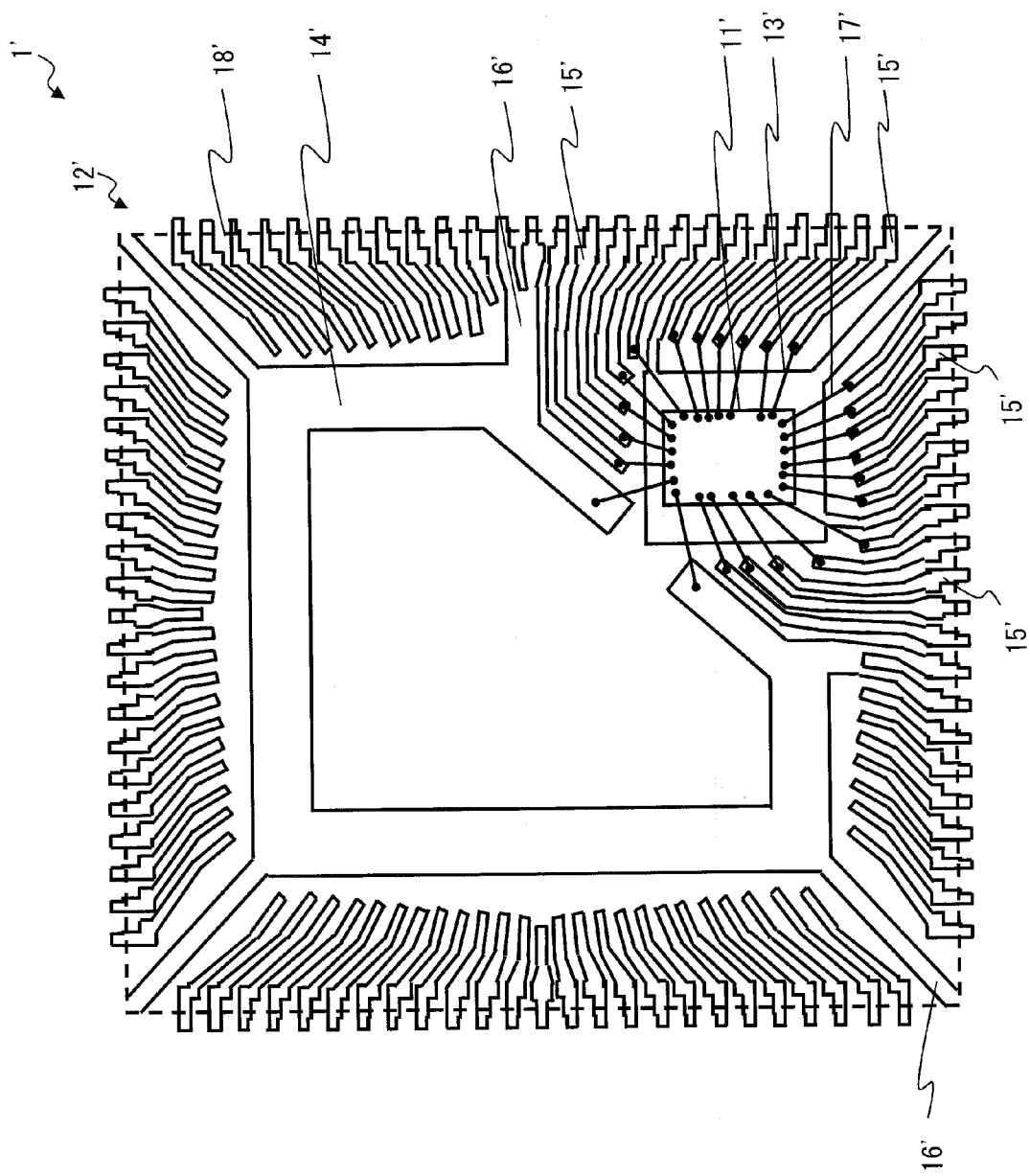
FIG. 13 is a plan view showing a modification of the semiconductor device according to the first to fourth embodiments.

Although the above first to fourth embodiments explained, as an example, the case in which the planar shape of the semiconductor device is a substantially square shape, it is not limited to this. For example, as shown in FIG. 13, the planar shape of the semiconductor device may be rectangular. That is, the planar shape of the semiconductor device may be a rectangular shape or a substantially rectangular shape including a square and a rectangle.

Note that in FIG. 13, a semiconductor device 1', a semiconductor chip 11', a semiconductor package 12', a die pad 13', an antenna 14', lead terminals 15', suspension leads 16', bonding wires 17', and mold resin 18' correspond to the semiconductor device 1, the semiconductor chip 11, the semiconductor package 12, the die pad 13, the antenna 14, the lead terminals 15, the suspension leads 16, the bonding wires 17, and the mold resin 18, respectively.

Alternatively, the planar shape of the semiconductor device or the semiconductor package may be a polygonal shape. In this case, as in the above example, the semiconductor chip is mounted in one of the four regions divided by a line connecting midpoints of the longest side among sides composing the polygon and an opposing and parallel side to the longest side, and a line connecting the midpoints of the side perpendicular to the longest side and the opposing and parallel side to the side perpendicular to the longest side.

The first to fourth embodiments explained the examples in which the semiconductor package is a QFP, but it is not limited to this. For example, the semiconductor package may be a QFN (Quad Flat No lead package). Alternatively, as shown in FIG. 14, the semiconductor package may be a SOP (Small Outline Package).

Figure 14:
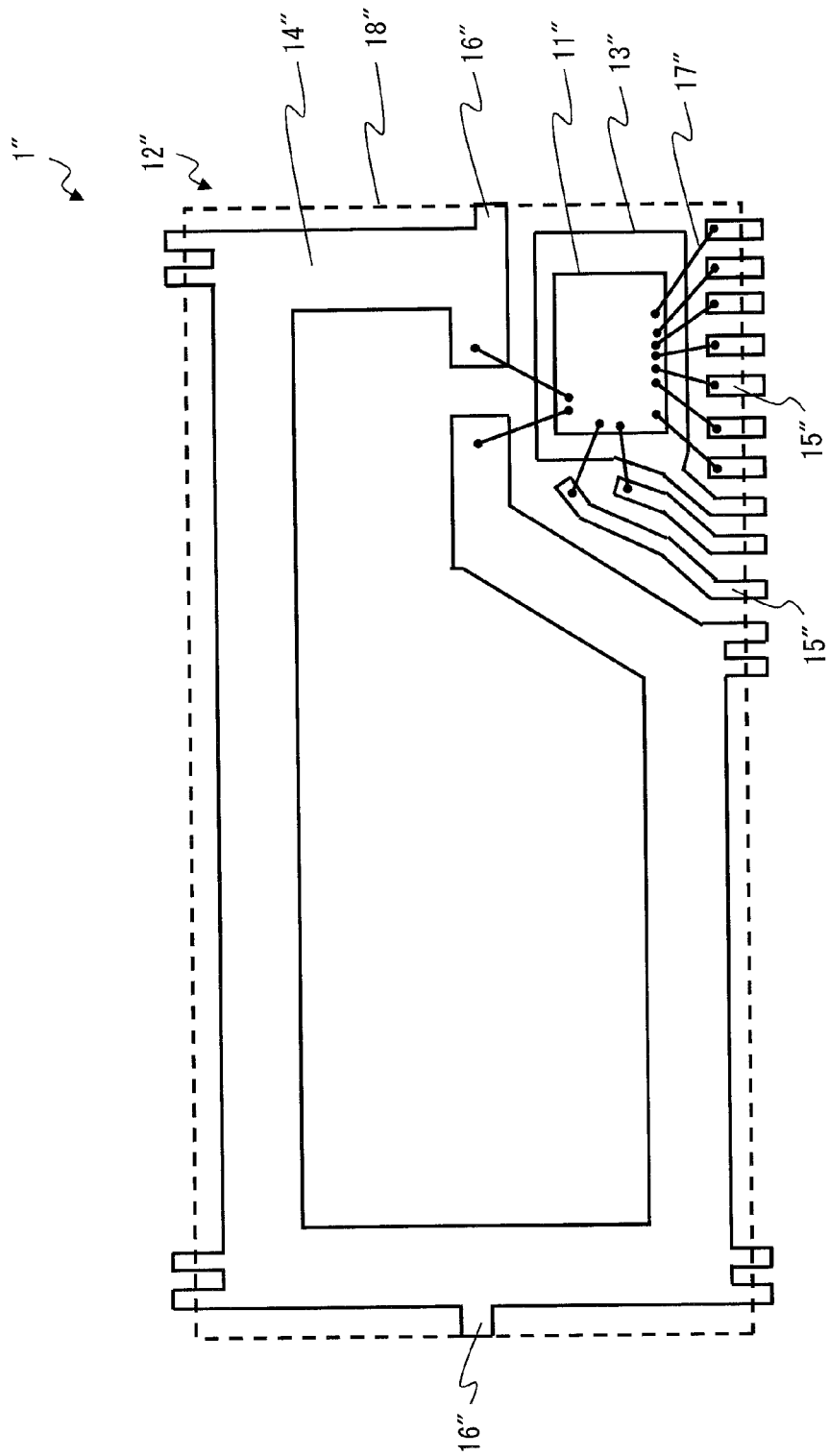
FIG. 14 is a plan view showing a modification of the semiconductor device according to the first to fourth embodiments.

Note that in FIG. 14, the semiconductor device 1", the semiconductor chip 11", the semiconductor package 12", the die pad 13", the antenna 14", the lead terminals 15", the suspension leads 16", the bonding wires 17", and the mold resin 18" respectively corresponds to the semiconductor device 1, the semiconductor chip 11, the semiconductor package 12, the die pad 13, the antenna 14, the lead terminals 15, the suspension leads 16, the bonding wires 17, and the mold resin 18 in FIG. 1.

The planar shape of the antennas shown in the first to fourth embodiments are preferably symmetric with respect to a diagonal line connecting between the first and third corners (lower right and upper left corners). This improves the symmetry of a transceiver signal (differential signal), thus data can be transmitted with high accuracy even when the communication is performed at a high data rate, for example. Further, for example, the antennas can readily face each other when a pair of semiconductor devices is disposed opposite to each other.

Moreover, the first to fourth embodiments explained, as an example, the case in which the first antenna part (first antenna body of the first antenna part in FIGS. 1, 5, and 6), the second antenna part, the third antenna part, and the fourth antenna part (second antenna body of the fourth antenna part in FIGS. 1, 5, and 6), are formed in parallel to the four sides of the semiconductor package. However, they are not necessarily need to be parallel.

Further, the first to fourth embodiments explained the case in which the four sides of the semiconductor chip are respectively parallel to the four sides of the semiconductor package as an example, they are not necessarily parallel. For example, the four sides of the semiconductor chip 11 may form 45 degrees with the semiconductor packages, respectively. Note that the planar shape of the die pad and the chip mounting part is changed as appropriate according to the disposed state of the semiconductor chips.

Moreover, the first to fourth embodiments explained the case in which the antenna width is fixed (the predetermined width) as an example, they are not necessarily fixed. The antenna width can be changed as appropriate according to the communication distance and the like for wireless baseband transmission, for example. Moreover, the antenna width is greater than the width of the lead terminal, for example.

The first to fourth embodiments explained, as an example, the case in which the both ends of the antennas are positioned near the corner closest to the centroid of the semiconductor package among the four corners of the die pad (i.e., semiconductor chip), it is not limited to this. When the electrode pads PD1 and PD2, and both ends of the antenna of the semiconductor chip are disposed in proximity to one other, the position of both ends of the antenna can be changed as appropriate. In this case, the disposed position of the electrode pads PD1 and PD2 is changed as appropriate.

Moreover, the first to fourth embodiments explained, as an example, the in which one semiconductor chip is mounted on the die pad or the chip mounting part, it is not limited to this. Two or more semiconductor chips may be mounted on the die pad or the chip mounting part. Hereinafter, some examples are explained using FIGS. 15 to 19.

Figure 15:
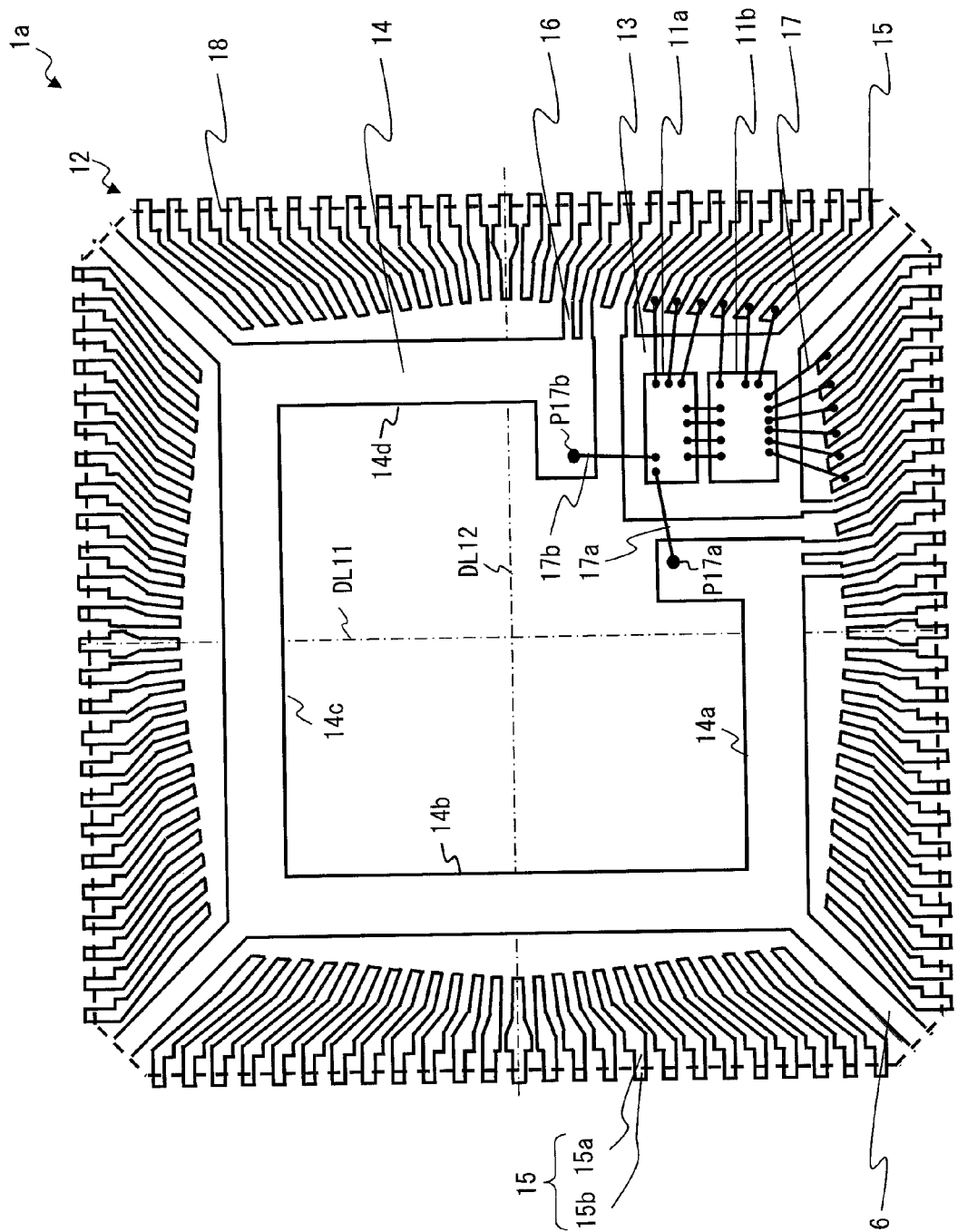
FIG. 15 is a plan view showing a modification of the semiconductor device according to the first embodiment.

FIG. 15 is a plan view showing a semiconductor device 1a as a modification of the semiconductor device 1 shown in FIG. 1. The semiconductor device 1a shown in FIG. 15 includes two semiconductor chips 11a and 11b mounted on the die pad 13 in place of the semiconductor chip 11 in the semiconductor device 1 shown in FIG. 1. Note that the two semiconductor chips 11a and 11b are connected via bonding wires 17.

Figure 16:
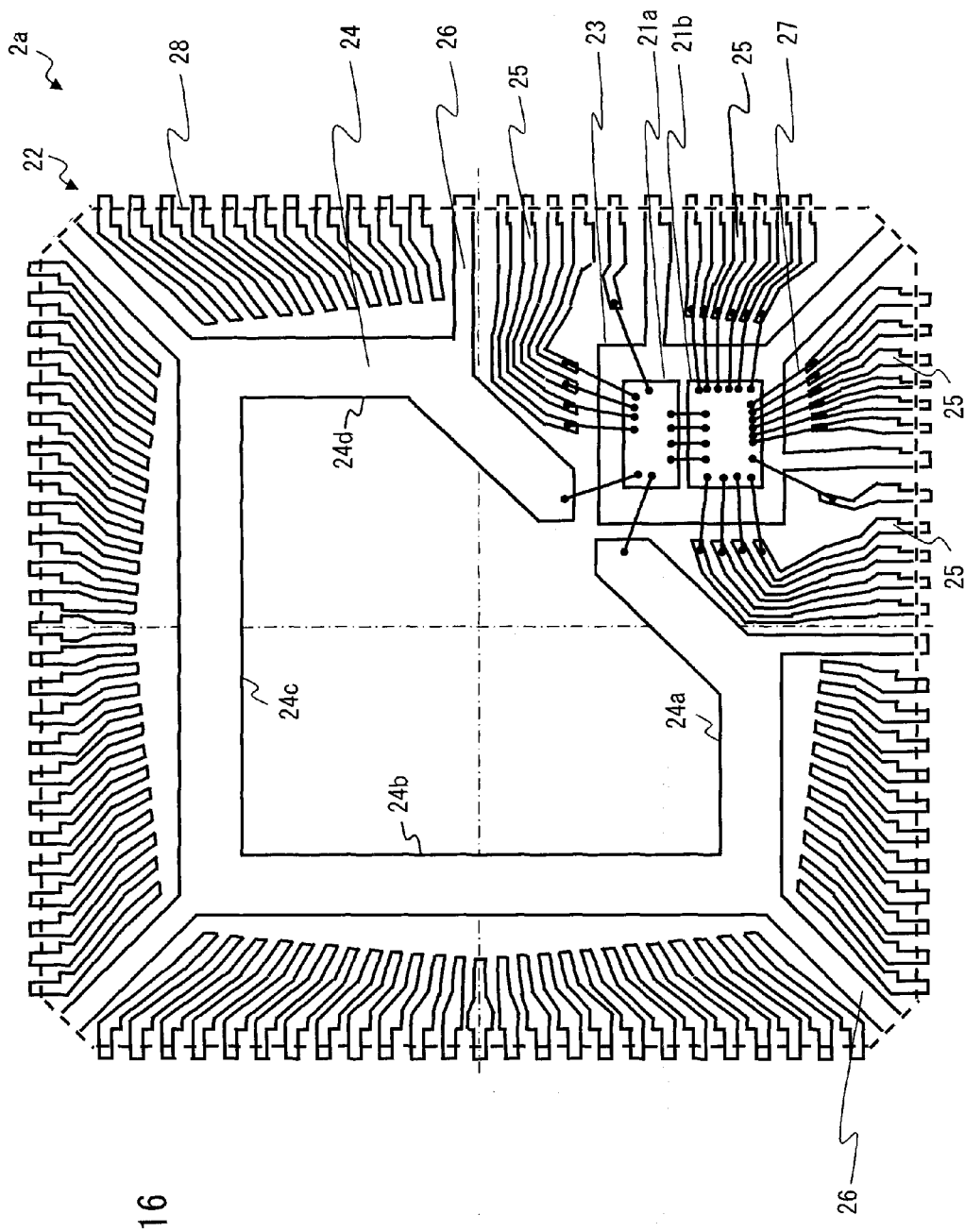
FIG. 16 is a plan view showing a modification of the semiconductor device according to the second embodiment.

FIG. 16 is a plan view showing a semiconductor device 2a as a modification of the semiconductor device 2 shown in FIG. 5. The semiconductor device 2a shown in FIG. 16 includes two semiconductor chips 21a and 21b mounted on the die pad 23 in place of the semiconductor chip 21 in the semiconductor device 2 shown in FIG. 5. Note that the two semiconductor chips 21a and 21b are connected via bonding wires 27.

Figure 17:
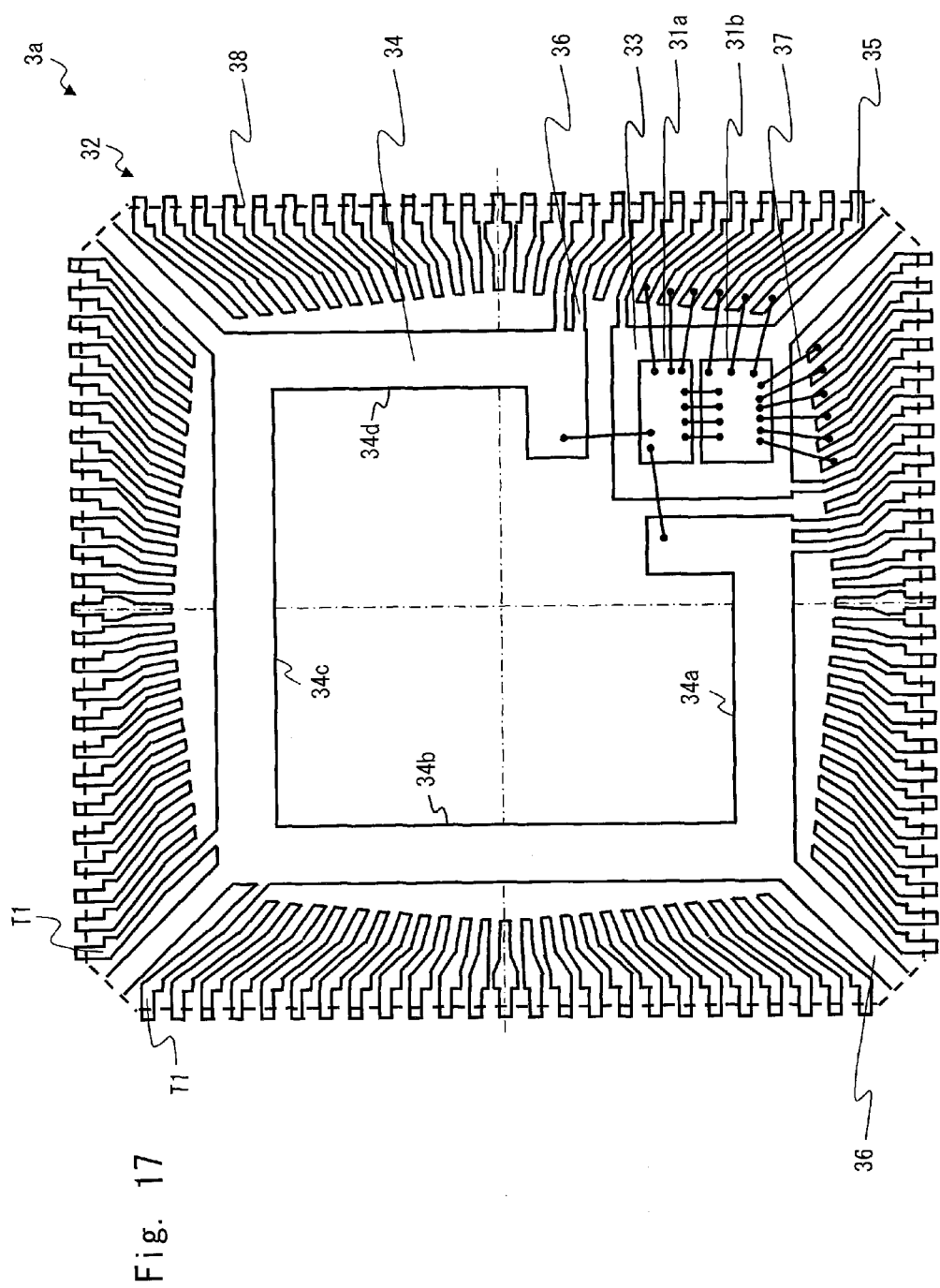
FIG. 17 is a plan view showing a modification of the semiconductor device according to the third embodiment.

FIG. 17 is a plan view showing a semiconductor device 3a as a modification of the semiconductor device 3 shown in FIG. 6. The semiconductor device 3a shown in FIG. 17 includes two semiconductor chips 31a and 31b mounted on a die pad 33 in place of the semiconductor chip 31 in the semiconductor device 3 shown in FIG. 6. Note that the two semiconductor chips 31a and 31b are connected via bonding wires 37.

Figure 18:
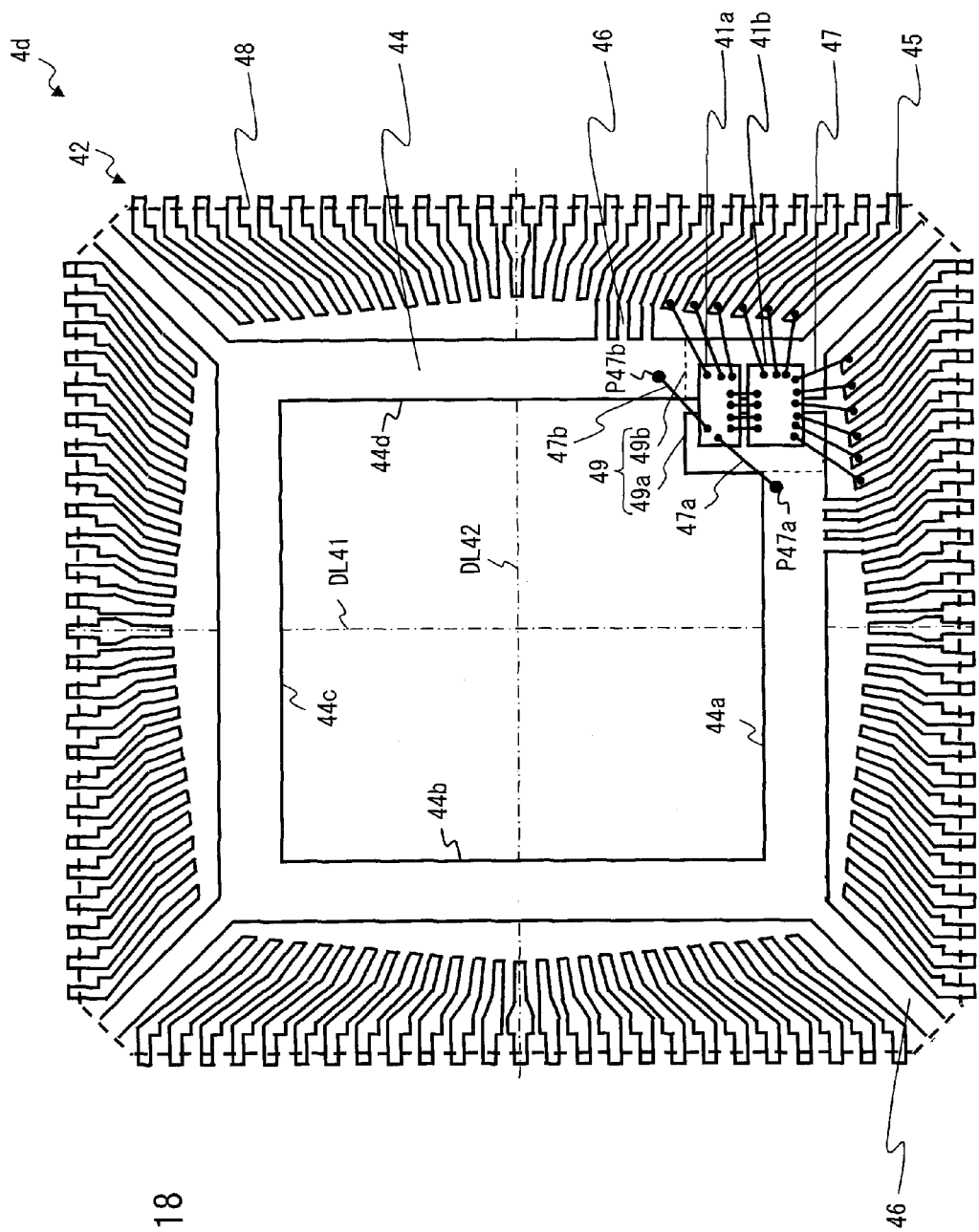
FIG. 18 is a plan view showing a modification of the semiconductor device according to the fourth embodiment.

FIG. 18 is a plan view showing a semiconductor device 4d as a modification of the semiconductor device 4 shown in FIG. 7. The semiconductor device 4a shown in FIG. 18 includes two semiconductor chips 41a and 41b mounted on a chip mounting part 49 in place of the semiconductor chip 41 in the semiconductor device 4 shown in FIG. 7. Note that the two semiconductor chips 41a and 41b are connected via bonding wires 47.

Figure 19:
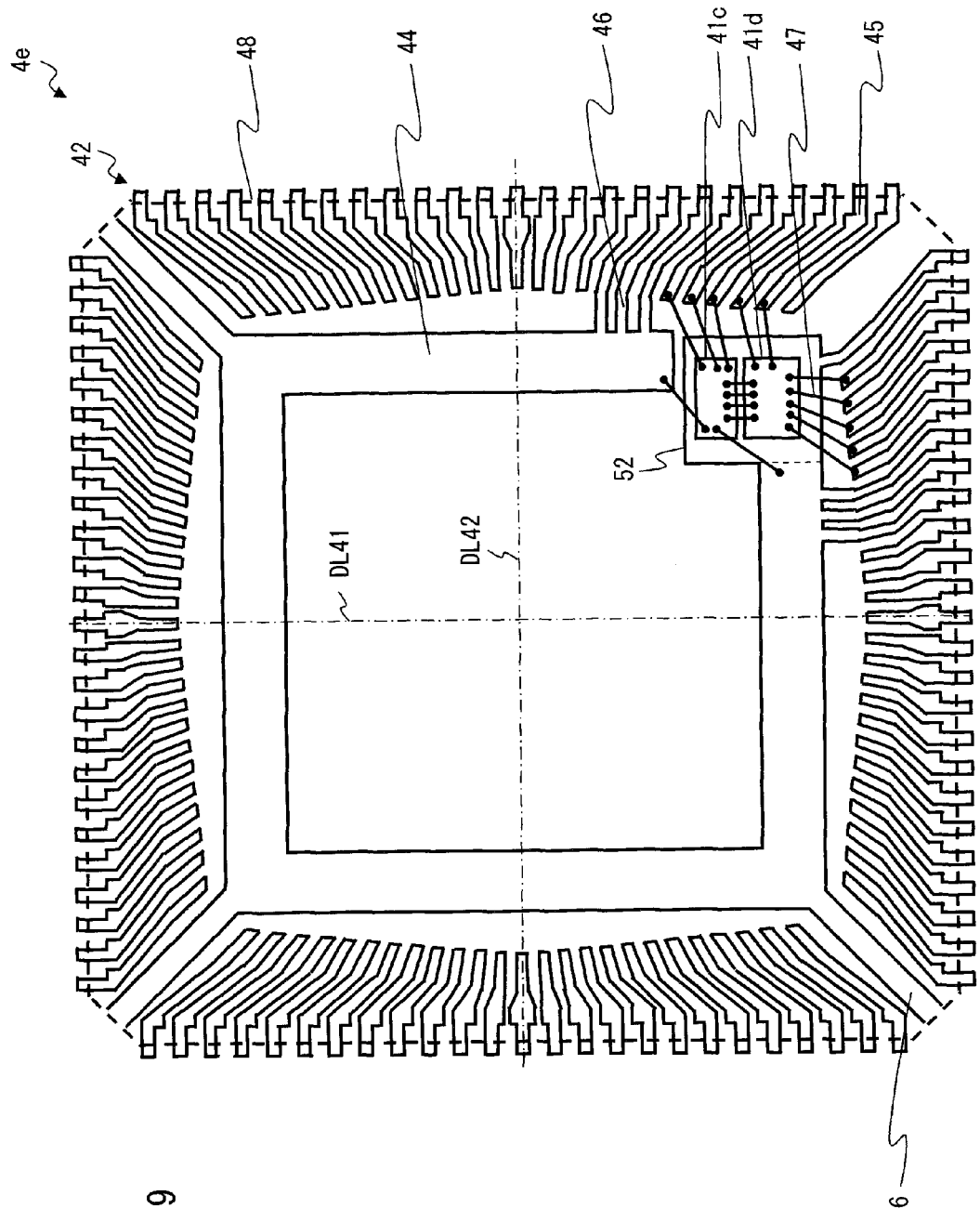
FIG. 19 is a plan view showing a modification of the semiconductor device according to the fourth embodiment.

FIG. 19 is a plan view showing a semiconductor device 4e as a modification of the semiconductor device 4c shown in FIG. 11. The semiconductor device 4e shown in FIG. 19 includes two semiconductor chips 41c and 41d mounted on a chip mounting part 52 in place of the semiconductor chip 41 in the semiconductor device 4c shown in FIG. 11. Note that the two semiconductor chips 41c and 41d are connected via the bonding wire 47.

In FIGS. 15 to 19, one semiconductor chips (first semiconductor chips) 11a, 21a, 31a, 41a, and 41c have a function equivalent to the semiconductor chips 11, 21, 31, 41, and 41, respectively. That is, one semiconductor chips 11a, 21a, 31a, 41a, and 41c each include at least one of the transmission circuit Tx1 and the reception circuit Rx1. Additionally, one semiconductor chips 11a, 21a, 31a, 41a, and 41c can further include some of the abovementioned switch control circuit 111, the calculation circuit, the clock generation circuit, the clock reproduction circuit, the AD/DA conversion circuit, the memory circuit, the power supply circuits, and the like. Meanwhile, other semiconductor chips (second semiconductor chips) 11b, 21b, 31b, 41b, and 41d each include some or all of remaining switch control circuit 111, the calculation circuit, the clock generation circuit, the clock reproduction circuit, the AD/DA conversion circuit, the memory circuit, the power supply circuits, and the like, or other circuits.

Note that at this time, one and other semiconductor chips (first and second semiconductor chips) are disposed in one of the four regions in the semiconductor package sectioned by the line segment connecting the midpoints of two pairs of opposing sides of the semiconductor package. Moreover, the centroids of one and other semiconductor chips (first and second semiconductor chips) are positioned outside the closed curve that is composed of the line segment connecting the both ends of the antenna by the straight line and the line on the antenna connecting the both ends of the antenna. That is, the centroids of the semiconductor chips are positioned outside the closed curve composed of the line segment connecting the one end and the other end of the antenna by the straight line and the line connecting the one end and the other end of the antenna along the antenna. Then, the semiconductor device that mounts the plurality of semiconductor chips as the ones shown in FIGS. 15 to 19 can achieve advantages equivalent to the first to fourth embodiments. Further, the number of semiconductor chips mounted can be changed as appropriate as long as these conditions are satisfied.

Note that the semiconductor chips 11, 21, 31, 41, 11a, 11b, 21a, 21b, 31a, 31b, 41a, 41b, 41c, and 41d are generally formed into rectangles. Generally in a broad view, the semiconductor chips are formed to be substantially same, the centroids of the semiconductor chips 11, 21, 31, 41, 11a, 11b, 21a 21b, 31a, 31b, 41a, 41b, 41c, and 41d correspond to intersections of diagonal lines on the surface where the semiconductor chip is mounted.

The first and fourth embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor device comprising:
   a semiconductor chip; and
   a semiconductor package that seals the semiconductor chip and has a substantially rectangular planar shape, wherein
   the semiconductor chip comprises:
     first and second electrode pads; and
     at least one of a transmission circuit that transmits a signal via the first and second electrode pads and a reception circuit that receives the signal via the first and second electrode pads,
   the semiconductor package comprises:
     an antenna formed of a lead frame;
     a first wire that connects the antenna and the first electrode pad; and
     a second wire that connects the antenna and the second electrode pad,
   the semiconductor chip is disposed in one of four regions in the semiconductor package that are sectioned by line segments connecting midpoints of two pairs of opposing sides of the semiconductor package, and
   a centroid of the semiconductor chip is positioned outside a closed curve that is composed of a line segment connecting by a straight line a first connection point where the antenna and the first wire are connected and a second connection point where the antenna and the second wire are connected, and a line connecting the first connection point and the second connection point along the antenna.

2. The semiconductor device according to claim 1, wherein the four regions are divided by a line connecting midpoints of a first side, which is a longest side among sides composing an outer perimeter of the semiconductor package, and a second side, which is an opposing and parallel side to the first side, and a line connecting midpoints of a third line, which is perpendicular to the first side, and a fourth side, which is an opposing and parallel side to the third side.

3. The semiconductor device according to claim 1, wherein the entire semiconductor chip is disposed outside the closed curve.

4. The semiconductor device according to claim 1, wherein the first and second electrode pads are disposed along a side inside the semiconductor package among four sides of the semiconductor chip.

5. The semiconductor device according to claim 1, further comprising:
   a die pad; and
   a plurality of lead terminals, wherein
   the antenna, the die pad, and the plurality of lead terminals are formed using a lead frame, and
   the semiconductor chip is mounted on the die pad and connected to some or all of the plurality of lead terminals.

6. The semiconductor device according to claim 5, wherein some of the plurality of lead terminals are disposed between the antenna and the die pad.

7. The semiconductor device according to claim 1, wherein the semiconductor package further includes a die pad that is formed electrically separated from the antenna and mounts the semiconductor chip.

8. The semiconductor device according to claim 1, wherein the semiconductor package further comprises a chip mounting part that is integrally formed with one of one end and the other end of the antenna and also formed with a predetermined interval from remaining one of the one end and the other end of the antenna.

9. The semiconductor device according to claim 1, wherein the semiconductor package further comprises:
   a first chip mounting part that is integrally formed with the one end of the antenna and mounts a part of the semiconductor chip; and
   a second chip mounting part that is integrally formed with the other end of the antenna, also formed with a predetermined interval from the first chip mounting part, and mounts another part of the semiconductor chip.

10. The semiconductor device according to claim 9, wherein each of opposing sides of the first and second chip mounting parts is substantially parallel to a diagonal line connecting a corner closest to the semiconductor chip among four corners of the semiconductor package and an opposing corner thereto.

11. The semiconductor device according to claim 10, wherein each of the opposing sides of the first and second chip mounting parts is formed in a zigzag form.

12. The semiconductor device according to claim 1, wherein the antenna comprises a center tap supplied with fixed potential from outside.

13. The semiconductor device according to claim 12, wherein in the antenna, a shape between the center tap and the one end of the antenna and a shape between the center tap and the other end of the antenna are substantially same.

14. The semiconductor device according to claim 1, wherein the semiconductor package has a substantially square planar shape.

15. The semiconductor device according to claim 14, wherein the antenna is formed to be symmetric with respect to the diagonal line connecting the corner closest to the semiconductor chip among the four corners of the semiconductor package and the opposing corner thereto.

16. The semiconductor device according to claim 1, wherein the antenna is formed with a predetermined width along the four sides of the semiconductor package.

17. The semiconductor device according to claim 1, wherein at least one of the four corners of the semiconductor package is chamfered.

18. The semiconductor device according to claim 1, wherein
   the semiconductor chip comprises:
     the transmission circuit; and
     a calculation processing device that performs a predetermined calculation process, and
   the transmission circuit transmits a signal according to information processed by the calculation processing device via the first and second electrode pads.

19. The semiconductor device according to claim 1, further comprising a second semiconductor chip that is different from the first semiconductor chip in addition to a first semiconductor chip, the first semiconductor chip being the semiconductor chip, wherein
   the first and second semiconductor chips are both disposed in one of the four regions in the semiconductor package that are sectioned by the line segments connecting the midpoints of the two pairs of the opposing sides of the semiconductor package, and
   centroids of the first and second semiconductor chips are positioned outside the closed curve that is composed of the line segment connecting by the straight line the first connection point where the antenna and the first wire are connected and the second connection point where the antenna and the second wire are connected, and the line connecting the first connection point and the second connection point along the antenna.

20. A communication system comprising a pair of the semiconductor devices according to claim 1, wherein the pair of semiconductor devices is disposed opposite to each other so that the antennas face each other.

\* \* \* \* \*